US012562228B2

(12) United States Patent
Sanuki et al.

(10) Patent No.: US 12,562,228 B2
(45) Date of Patent: Feb. 24, 2026

(54) DATA LATCH CIRCUIT AND SEMICONDUCTOR STORAGE DEVICE

(71) Applicant: KIOXIA CORPORATION, Tokyo (JP)

(72) Inventors: Tomoya Sanuki, Mie (JP); Koji Kohara, Kanagawa (JP); Keisuke Nakatsuka, Hyogo (JP)

(73) Assignee: Kioxia Corporation, Tokyo (JP)

( * ) Notice: Subject to any disclaimer, the term of this patent is extended or adjusted under 35 U.S.C. 154(b) by 686 days.

(21) Appl. No.: 17/898,868

(22) Filed: Aug. 30, 2022

(65) Prior Publication Data

US 2023/0197160 A1 Jun. 22, 2023

(30) Foreign Application Priority Data

Dec. 16, 2021 (JP) ................................. 2021-204613

(51) Int. Cl.
| | |
|---|---|
| *G11C 16/10* | (2006.01) |
| *G11C 7/06* | (2006.01) |
| *G11C 7/10* | (2006.01) |
| *G11C 11/419* | (2006.01) |
| *G11C 16/26* | (2006.01) |

(52) U.S. Cl.
CPC .............. *G11C 16/10* (2013.01); *G11C 7/065* (2013.01); *G11C 7/1039* (2013.01); *G11C 7/106* (2013.01); *G11C 7/1087* (2013.01); *G11C 11/419* (2013.01); *G11C 16/26* (2013.01); *G11C 2211/5642* (2013.01)

(58) Field of Classification Search
CPC ....... G11C 16/10; G11C 7/065; G11C 7/1039;
G11C 7/106; G11C 7/1087; G11C 11/419; G11C 16/26; G11C 2211/5642; G11C 11/412; G11C 8/16; G11C 11/418; H10B 10/12
See application file for complete search history.

(56) References Cited

U.S. PATENT DOCUMENTS

| | | | |
|---|---|---|---|
| 10,706,911 B1 | 7/2020 | Seo et al. | |
| 10,867,641 B2 | 12/2020 | Nakatsuka et al. | |

(Continued)

FOREIGN PATENT DOCUMENTS

| | | |
|---|---|---|
| CN | 110912552 A | 3/2020 |
| JP | 2001202775 A | 7/2001 |

(Continued)

OTHER PUBLICATIONS

Vita Pi-Ho Hu, et al., "High-Density and High-Speed 4T FinFET SRAM for Cryogenic Computing" 2021 IEEE International Electron Devices Meeting (IEDM), San Francisco, CA, USA, Dec. 11-16, 2021, pp. 8.6.1-8.6.4.

(Continued)

*Primary Examiner* — Donald HB Braswell
(74) *Attorney, Agent, or Firm* — Kim & Stewart LLP

(57) ABSTRACT

A data latch circuit includes a first transistor of a first conductivity type and a second transistor of the first conductivity type, and a third transistor of a second conductivity type and a fourth transistor of the second conductivity type. The third and fourth transistors are controlled to perform a first control operation to store data in the data latch circuit and to perform a second control operation to read the stored data.

10 Claims, 22 Drawing Sheets

10

(56)        References Cited

U.S. PATENT DOCUMENTS

| 2020/0020386 | A1* | 1/2020 | Yu ........................... H10D 89/10 |
| 2020/0090710 | A1 | 3/2020 | Nakatsuka et al. |
| 2021/0201999 | A1 | 7/2021 | Fujiwara et al. |
| 2021/0389930 | A1* | 12/2021 | Ramesh ............... G11C 7/1006 |
| 2023/0142173 | A1* | 5/2023 | Bertin ................ G11C 13/0011 |
| | | | 365/148 |

FOREIGN PATENT DOCUMENTS

| JP | 2020-048179 A | 3/2020 |
| TW | 202011574 A | 3/2020 |

OTHER PUBLICATIONS

Chinese Office Action mailed Jun. 26, 2025 in corresponding Chinese Patent Application 202211626052.0 with English Translation, 33 pages.

* cited by examiner

100

10

FIG. 3B
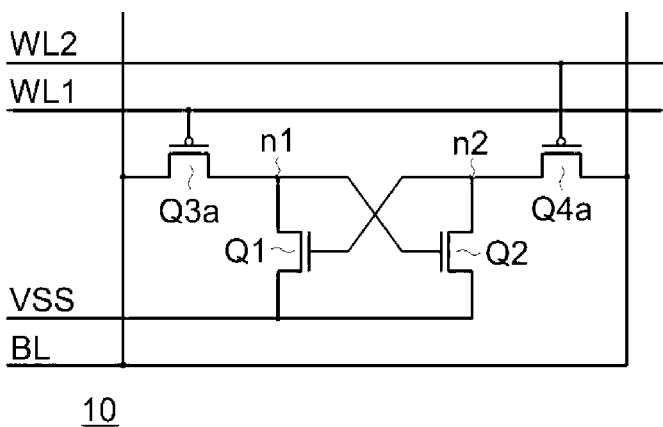
10
FIG. 4A
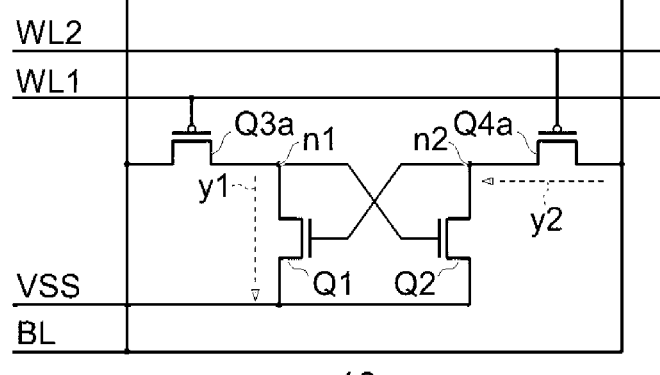
10
FIG. 4B
| INPUT | READ | WRITE | DATA STORAGE |
|---|---|---|---|
| WL1 | 0(×1) | 0(×2) | VDD×0.95−0.7 |
| WL2 | VDD×0.95−0.7(×1) | VDD | VDD×0.95−0.7 |
| BL | VDD pre-charge | 0(×3) | VDD |
*1: WHEN WL1 IS ACCESSED, WHEN WL2 IS ACCESSED, WL1 AND WL2 ARE INVERTED
*2: WHEN WL1 IS ACCESSED, WHEN WL2 IS ACCESSED, WL1 AND WL2 ARE INVERTED
*3: WHEN DATA TO BE WRITTEN IS 0, WHEN DATA TO BE WRITTEN IS 1, BL IS SET TO VDD

WL1

WL2

VSS

WL1

WL2

VSS

WL1

WL2

VSS

FIG. 11A
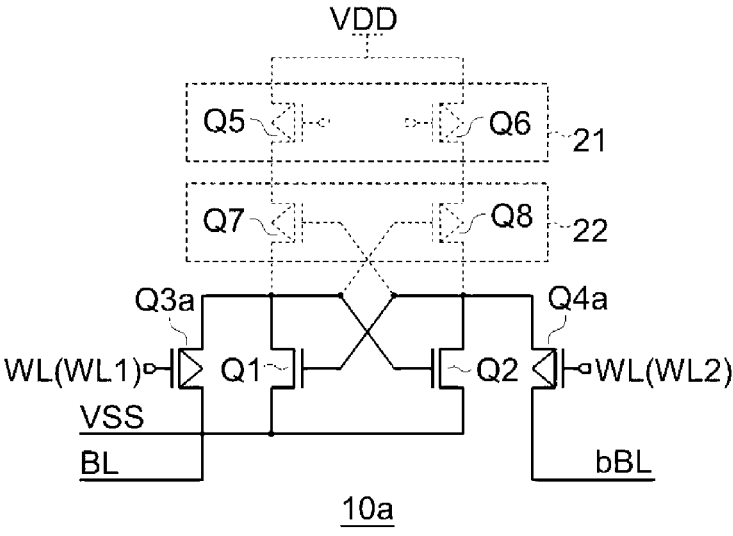
10a
FIG. 11B
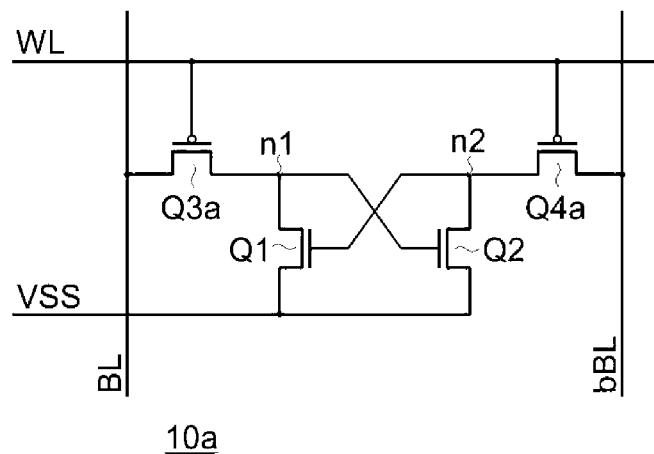
10a
FIG. 11C
| INPUT | READ | WRITE | DATA STORAGE |
|---|---|---|---|
| WL | 0 | 0 | VDD×0.95−0.7 |
| BL | VDD pre-charge | 0(×4) | VDD |
| bBL | VDD pre-charge | VDD(×4) | VDD |
*4: WHEN DATA TO BE WRITTEN IS 0, WHEN DATA TO BE WRITTEN IS 1, BL AND bBL ARE INVERTED

FIG. 16A
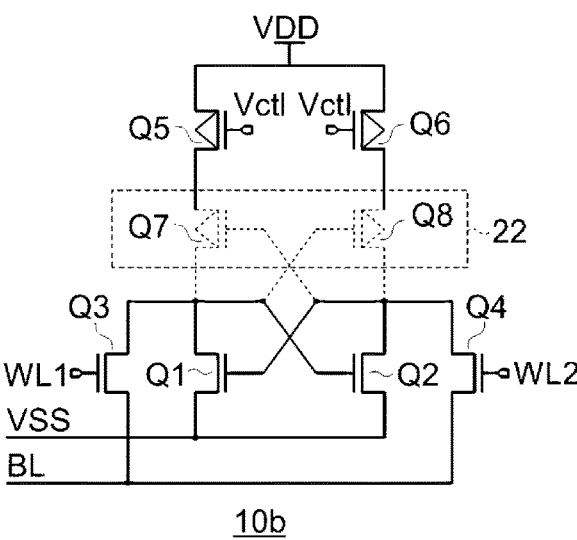
10b
FIG. 16B
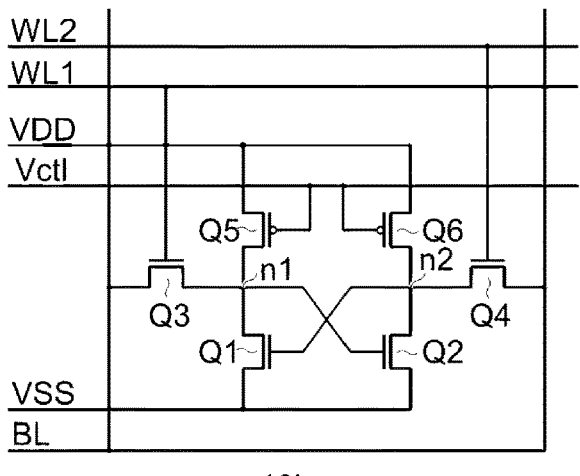
10b
FIG. 16C
| INPUT | READ | WRITE | DATA STORAGE |
|---|---|---|---|
| WL1 | VDD(×1) | VDD(×1) | 0 |
| WL2 | 0(×1) | 0(×1) | 0 |
| BL | VDD pre-charge | 0(×2) | VDD |
| Vctl | VDD×0.95−0.7 | VDD | VDD×0.95−0.7 |
*1: WHEN WL1 IS ACCESSED, WHEN WL2 IS ACCESSED, WL1 AND WL2 ARE INVERTED
*2: WHEN DATA TO BE WRITTEN IS 0, WHEN DATA TO BE WRITTEN IS 1, BL IS SET TO VDD

FIG. 19A
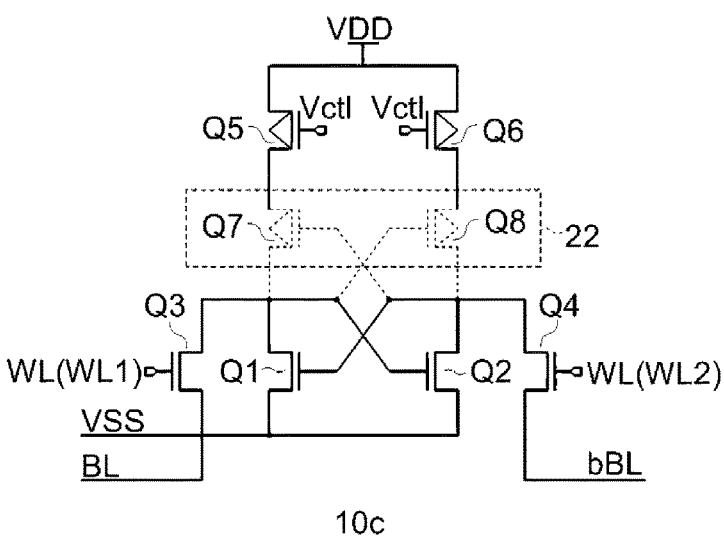
10c
FIG. 19B
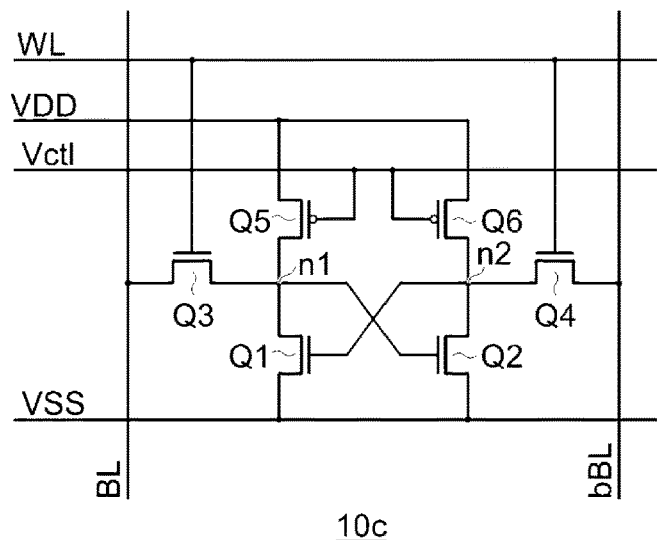
10c
FIG. 19C
| INPUT | READ | WRITE | DATA STORAGE |
|---|---|---|---|
| WL | VDD | VDD | 0 |
| BL | VDD pre-charge | 0(×3) | VDD |
| bBL | VDD pre-charge | VDD (×3) | VDD |
| Vctl | VDD×0.95−0.7 | VDD | VDD×0.95−0.7 |
*3: WHEN DATA TO BE WRITTEN IS 0, WHEN DATA TO BE
WRITTEN IS 1, BL AND bBL ARE INVERTED

DATA LATCH CIRCUIT AND SEMICONDUCTOR STORAGE DEVICE

CROSS-REFERENCE TO RELATED APPLICATION

This application is based upon and claims the benefit of priority from Japanese Patent Application No. 2021-204613, filed Dec. 16, 2021, the entire contents of which are incorporated herein by reference.

FIELD

Embodiments described herein relate generally to a data latch circuit and a semiconductor storage device.

BACKGROUND

Bit density of flash memory continuously increases by the use of multi-level cells (MLCs) and three-dimensional stacking. As the bit density thereof increases, the area of peripheral circuits also increases. Among the peripheral circuits, a data latch circuit (also referred to as a page buffer) occupies the largest area. When the data latch circuit cannot be made smaller, it becomes difficult to reduce the size of the flash memory chip.

DESCRIPTION OF THE DRAWINGS

FIG. 3B is a circuit diagram of the data latch circuit according to the first embodiment.

FIG. 4A is a diagram showing operation of the data latch circuit according to the first embodiment.

FIG. 4B is a diagram showing voltage of a word line and a bit line when the data latch circuit in FIG. 4A reads data, writes the same, and stores the same.

FIG. 10B is a layout diagram in which a plurality of data latch circuits having layout arrangement in FIG. 9B are located in the first direction and the second direction.

FIG. 11A is a diagram showing characteristics of a data latch circuit according to a second embodiment.

FIG. 11B is a circuit diagram of the data latch circuit according to the second embodiment.

FIG. 11C is a diagram showing voltage of a word line and a bit line when the data latch circuit in FIG. 11B reads data, writes the same, and stores the same.

FIG. 15A is a layout diagram in which a plurality of data latch circuits having layout arrangement in FIG. 14A are located in the first direction and the second direction.

FIG. 15B is a layout diagram in which a plurality of data latch circuits having layout arrangement shown in FIG. 14B are located in the first direction and the second direction.

FIG. 16A is a diagram showing characteristics of a data latch circuit according to a third embodiment.

FIG. 16B is a circuit diagram of the data latch circuit according to the third embodiment.

FIG. 16C is a diagram showing voltage of a word line, a bit line, and a control signal when the data latch circuit in FIG. 16B reads data, writes the same, and stores the same.

FIG. 19A is a diagram showing characteristics of a data latch circuit according to a fourth embodiment.

FIG. 19B is a circuit diagram of the data latch circuit according to the fourth embodiment.

FIG. 19C is a diagram showing voltage of a word line, a bit line, and a control signal when the data latch circuit in FIG. 16B reads data, writes the same, and stores the same.

DETAILED DESCRIPTION

Figure 1:
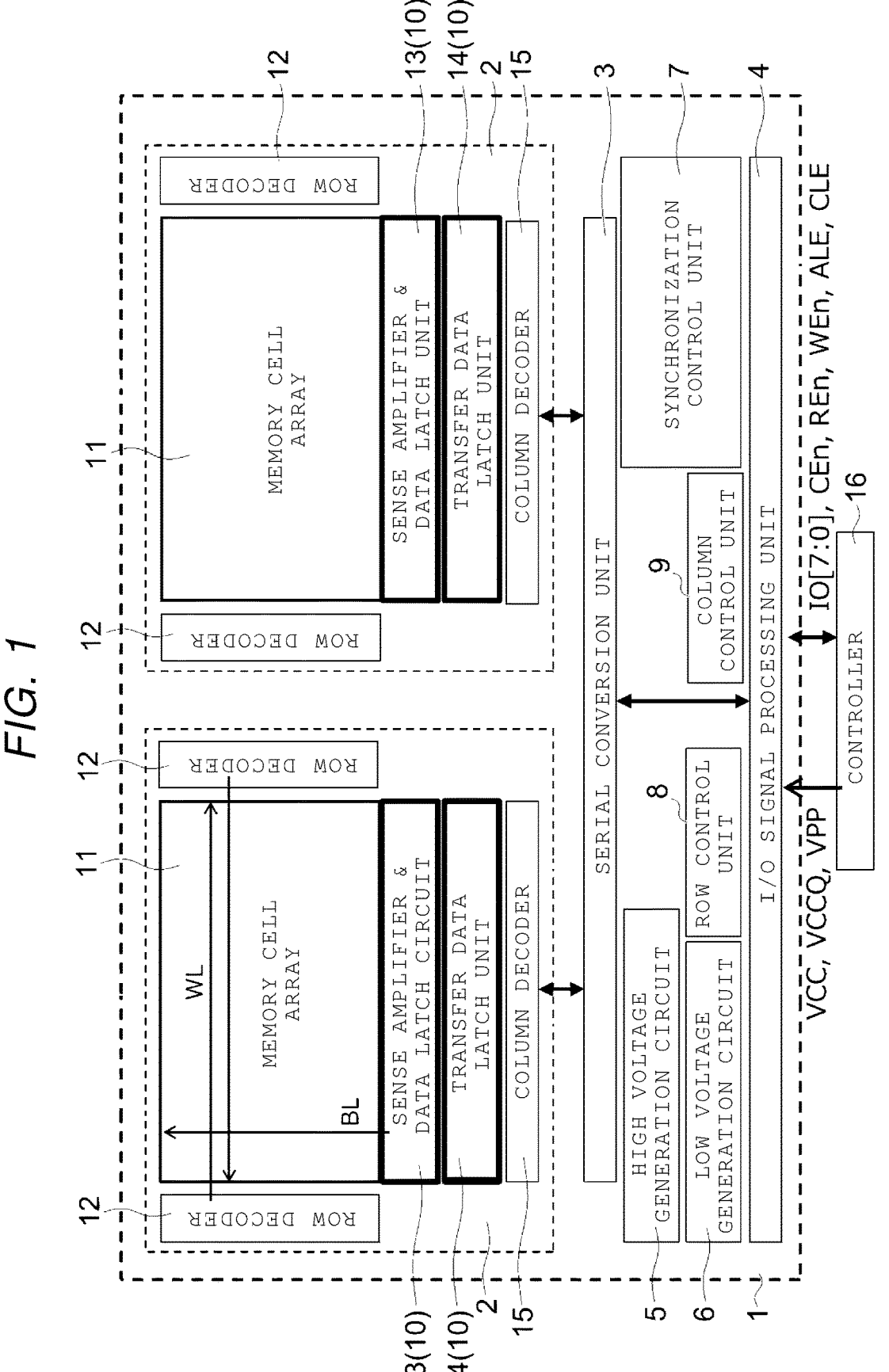
FIG. 1 is a block diagram showing a schematic configuration of a semiconductor storage device including a data latch circuit according to a first embodiment.

Embodiments provide a data latch circuit and a semiconductor storage device capable of being miniaturized.

In general, according to one embodiment, a data latch circuit includes a first transistor of a first conductivity type and a second transistor of the first conductivity type, and a third transistor of a second conductivity type and a fourth transistor of the second conductivity type. The third and fourth transistors are controlled to perform a first control operation to store data in the data latch circuit and to perform a second control operation to read the stored data.

Hereinafter, embodiments of a data latch circuit and a semiconductor storage device will be described with reference to the drawings. In the following description, main components of the data latch circuit and the semiconductor storage device will be mainly described. The data latch circuit and the semiconductor storage device may have components and functions not shown in the drawings or not described in this specification. The following description is not intended to exclude the components or the functions not shown in the drawings or not described in this specification.

First Embodiment

FIG. 1 is a block diagram showing a schematic configuration of a semiconductor storage device 1 including a data latch circuit 10 according to a first embodiment. The semiconductor storage device 1 in FIG. 1 shows a schematic configuration of flash memory. The semiconductor storage device 1 according to the embodiment is applicable to various types of semiconductor memory other than the flash memory. More specifically, the semiconductor storage device 1 according to the embodiment is applicable to a nonvolatile memory such as MRAM (Magnetoresistive Random Access Memory) and is also applicable to volatile memory such as DRAM (Dynamic Random Access Memory) and SRAM (Static Random Access Memory). Additionally, the flash memory may be a NAND flash memory or a NOR flash memory, and the semiconductor storage device 1 according to the embodiment is applicable to both the NAND flash memory and the NOR flash memory. In the following description, an example in which the semiconductor storage device 1 according to the embodiment is applied to the flash memory will be mainly described.

The semiconductor storage device 1 in FIG. 1 includes a plurality of memory modules 2, a serial conversion unit 3, an I/O signal processing unit 4, a high voltage generation circuit 5, a low voltage generation circuit 6, a synchronization control unit 7, a row control unit 8, and a column control unit 9.

Each of the memory modules 2 includes a memory cell array 11, a row decoder 12, a sense amplifier & data latch unit 13, a transfer data latch unit 14, and a column decoder 15.

The memory cell array 11 has a configuration in which a plurality of strings, having a plurality of NAND flash memory cells provided therein in the form of a cascode connection, are located in a two-dimensional configuration. The row decoder 12 decodes a row address signal and drives a corresponding word line.

The sense amplifier & data latch unit 13 writes data to the memory cell array 11 and reads the data from the memory cell array 11 via a bit line BL. The sense amplifier & data latch unit 13 includes the data latch circuit (DL) 10, according to the embodiment, which is configured to store the data to be written to the memory cell array 11 and to store the data read from the memory cell array 11.

The transfer data latch unit 14 temporarily stores the data to be written to the memory cell array 11 or the data read from the memory cell array 11. The transfer data latch unit 14 also includes the data latch circuit 10 according to the embodiment.

The column decoder 15 performs predetermined operation processing including decoding processing for the data to be written to the memory cell array 11 or the data to be read from the memory cell array 11.

The serial conversion unit 3 converts the data read from the memory cell array 11 into serial data, and supplies the converted data to the I/O signal processing unit 4. Further, the serial conversion unit 3 converts the serial data to be written, transmitted from the I/O signal processing unit 4, into parallel data and sends the same to the column decoder 15.

The I/O signal processing unit 4 performs high-speed serial communication with a controller 16. The high voltage generation circuit 5 boosts power supply voltage VDD supplied from the outside, thereby generating high-voltage VPGM, VERA, VPASS, and the like to be used when data is written to or erased from the memory cell.

The low voltage generation circuit 6 generates a reference voltage, a clock signal, a low power supply voltage, and the like to be used in the semiconductor storage device 1.

The synchronization control unit 7 performs timing control, sequence control, parameter control for each block in the semiconductor storage device 1.

The row control unit 8 controls the timing of driving a word line in each memory cell array 11. The column control unit 9 controls the timing of driving a bit line in each memory cell array 11.

As described above, the data latch circuit 10 according to the embodiment is provided in the sense amplifier & data latch unit 13 and the transfer data latch unit 14 in the semiconductor storage device 1 in FIG. 1. The data latch circuit 10 according to the embodiment may be provided in a place other than the sense amplifier & data latch unit 13 and the transfer data latch unit 14.

The flash memory having the block configuration shown in FIG. 1 is currently the lowest cost non-volatile memory, and is generally used as a large-capacity storage in various applications. In the block configuration shown in FIG. 1, components other than the memory cell array 11 may be referred to as peripheral circuits. The data latch circuit 10 occupies most of the area of the peripheral circuits. The data latch circuit 10, which is used as a temporary storage place, is configured to temporarily store the data to be written to the memory cell array 11 and the data read from the same.

In the flash memory configured to change from a planar structure to a three-dimensional structure, the bit density thereof is improved by increasing the number of bits per cell, implementing a multi-level cell (MLC), and increasing the number of stacked word lines. Here, as the bit density thereof increases, the area of the peripheral circuit increases.

When the ratio of the area of the peripheral circuit to the total area of the flash memory chip becomes large, the number of bits per wafer is reduced, and bit costs increase. As a solution to reduce the area of the flash memory chip, proposed are a CUA (CMOS Under Array) structure, in which the peripheral circuit is disposed below the memory cell array 11, and a CBA (CMOS Bonded Array) structure, in which a wafer having the memory cell array 11 disposed thereon and a wafer having the peripheral circuit disposed thereon are bonded together. In both the CUA structure and the CBA structure, when the area of the peripheral circuit is larger than that of the memory cell array 11, the area of the flash memory chip increases.

Therefore, the semiconductor storage device 1 according to the embodiment is characterized in that the area of the data latch circuit 10 in the peripheral circuit is reduced. Hereinafter, first, a circuit configuration of a general-purpose data latch circuit 100 according to a comparative example will be described.

Figure 2:
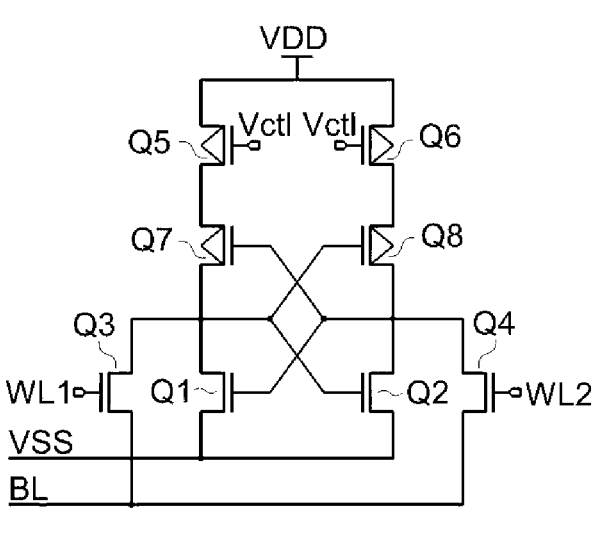
FIG. 2 is a circuit diagram of a data latch circuit according to a comparative example.

FIG. 2 is a circuit diagram of the data latch circuit 100 according to the comparative example. The data latch circuit 100 in FIG. 2 includes eight transistors Q1 to Q8. Among the eight transistors Q1 to Q8, four transistors are referred to as NMOS transistors Q1 to Q4, and the remaining four transistors are referred to as PMOS transistors Q5 to Q8.

A drain of the transistor Q1 is connected to a gate of the transistor Q2, a drain of the transistor Q3, a drain of the transistor Q7, and a gate of the transistor Q8. A drain of the transistor Q2 is connected to a gate of the transistor Q1, a drain of the transistor Q4, a gate of the transistor Q7, and a drain of the transistor Q8. Sources of the transistors Q1 and Q2 are connected to a reference voltage VSS node (for example, a ground node).

A word line WL1 is connected to a gate of the transistor Q3, and a word line WL2 is connected to a gate of the transistor Q4. Only one of the word lines WL1 and WL2 goes to a high level. Sources of the transistors Q3 and Q4 are connected to a bit line BL.

In this manner, the data latch circuit 100 in FIG. 2 includes two word lines WL1 and WL2 and one bit line BL.

A source of the transistor Q5 is connected to a power supply voltage VDD node, a drain of the transistor Q5 is connected to a source of the transistor Q7, and a control signal Vctl is input to a gate of the transistor Q5. A source of the transistor Q6 is connected to the power supply voltage VDD node, a drain of the transistor Q6 is connected to a source of the transistor Q8, and a control signal Vctl is input to the gate of the transistor Q7. When the control signal Vctl is a low level, both the transistors Q5 and Q6 are turned ON. In this case, when either the word line WL1 or the WL2 goes to a high level, the nodes n1 and n2 store the data on the bit line BL.

As shown in FIG. 2, the data latch circuit 100 according to the comparative example is formed of eight transistors Q1 to Q8. Accordingly, as the number of data latch circuits 100 increases, the number of transistors increases by a multiple of 8, which results in increasing the area of the semiconductor storage device 1.

Figure 3A:
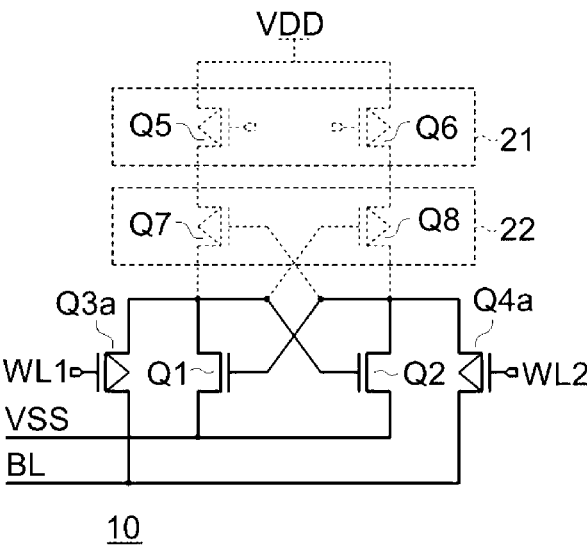
FIG. 3A is a diagram showing characteristics of the data latch circuit according to the first embodiment.

FIG. 3A is a diagram showing characteristics of the data latch circuit 10 according to the first embodiment, and FIG. 3B is a circuit diagram of the data latch circuit 10 according to the first embodiment.

As shown in FIG. 3A, the data latch circuit 10 according to the first embodiment has a configuration in which a first transistor group 21 including the transistors Q5 and Q6, a second transistor group 22 including the transistors Q7 and Q8, and VDD are omitted from the data latch circuit 100 according to the comparative example of FIG. 2. Further, the data latch circuit 10 according to the first embodiment includes PMOS transistors Q3a and Q4a instead of the NMOS transistors Q3 and Q4 in FIG. 2.

As described above, the data latch circuit 10 according to the first embodiment includes two NMOS transistors Q1 and Q2 and two PMOS transistors Q3a and Q4a.

As shown in FIG. 3B, the drain of the transistor Q1 is connected to the gate of the transistor Q2 and a source of the transistor Q3a. This connection node is referred to as a node n1. The drain of the transistor Q2 is connected to the gate of the transistor Q1 and a source of the transistor Q4a. This connection node is referred to as a node n2.

The sources of the transistors Q1 and Q2 are connected to the ground node. A gate of the transistor Q3a is connected to the word line WL1 and a gate of the transistor Q4a is connected to the word line WL2. The drains of the transistors Q3a and Q4a are connected to the bit line.

FIG. 4A is a diagram showing operation of the data latch circuit 10 according to the first embodiment. The data latch circuit 10 according to the first embodiment performs data write operation, data storage operation, and data read operation. Two word lines WL1 and WL2 do not go to the low level at the same time. When one of the word lines WL1 and WL2 goes to the high level, the data write operation is performed. For example, when the word line WL1 is the low level and the word line WL2 is the high level, the transistor Q3a is turned ON and the transistor Q4a is turned OFF. Accordingly, the voltage of the bit line BL is transmitted to the node n1 via the transistor Q3a. For example, when the bit line BL has low voltage, the node n1 also becomes low voltage, and when the bit line BL has high voltage, the node n1 also becomes high voltage. The node n2 becomes inverted logical voltage to the node n1. The transistors Q1 and Q2 perform operation of storing the voltage of the nodes n1 and n2.

In the data storage operation, the two word lines WL1 and WL2 are both set to voltage levels slightly lower than the power supply voltage VDD. The bit line BL is set to VDD. The voltage level slightly lower than the power supply voltage VDD is, for example, a voltage level lower than the power supply voltage VDD by 5 to 30%. More specifically, the voltage levels of the gates of the transistors Q3a and Q4a in a period during which the data is stored in the nodes n1 and n2 are lowered by any percentage in a range of 5 to 30% of the high voltage levels of the gates of the transistors Q3a and Q4a when the data is written to the nodes n1 and n2. The reason for setting the word lines WL1 and WL2 to the voltage levels slightly lower than the power supply voltage VDD during the data storage period is to allow leakage current to flow through the transistors Q3a and Q4a, the gates of which are connected to the word lines WL1 and WL2, respectively.

For example, when the node n1 has the low voltage, the transistor Q1 is turned ON, and the voltage of the node n1 is stored at low voltage from the ground voltage VSS node via the transistor Q1, as shown by a dashed arrow line y1 in FIG. 4A. On the other hand, the transistor Q2 is turned OFF, and the voltage of the node n2 is stored at high voltage by leakage current flowing from the bit line BL through the transistor Q4a, as shown by a dashed arrow line y2 in FIG. 4A.

In this manner, the word lines WL1 and WL2 are set to the voltage level slightly lower than the power supply voltage VDD and the bit line BL is set to VDD. Here, when the node n1 has high voltage, the voltage level of the node n1 is maintained by leakage current flowing from the bit line BL through the transistor Q3a. Further, when the node n2 has high voltage, the voltage level of the node n2 is maintained by the leakage current flowing from the bit line BL through the transistor Q4a.

FIG. 4B is a diagram showing the voltage of the word lines WL1 and WL2, and the bit line BL when the data latch circuit 10 in FIG. 4A reads data, writes the same, and stores the same. FIG. 4B shows an example in which the word line WL1 is accessed. Here, when the word line WL2 is accessed, a voltage relationship between the word lines WL1 and WL2 in FIG. 4B is reversed.

When the data latch circuit 10 reads the data stored in the nodes n1 and n2 via the transistor Q3a, the word line WL1 is set to the ground voltage VSS (for example, 0 V) and the word line WL2 is set to voltage slightly lower than the power supply voltage VDD (for example, VDD×0.95–0.7 V). Further, the bit line BL is pre-charged to the power supply voltage VDD in advance. Accordingly, the data stored in the nodes n1 and n2 are read in the bit line BL via the transistor Q3a.

When the data latch circuit 10 writes the data to the nodes n1 and n2 via the transistor Q3a, the word line WL1 is set to the ground voltage VSS (for example, 0 V), and the word line WL2 is set to the power supply voltage VDD. When the data to be written is 0, the bit line BL is set to the ground voltage VSS (for example, 0 V). Accordingly, the data of "0" is stored in the nodes n1 and n2 via the transistor Q3a. Meanwhile, when the data to be written is 1, the bit line BL is set to the power supply voltage VDD.

When the data latch circuit 10 stores the data in the nodes n1 and n2, the word lines WL1 and WL2 are set to voltage slightly lower than the power supply voltage VDD (for example, VDD×0.95–0.7 V), and the bit line BL is set to the power supply voltage VDD.

Figure 5:
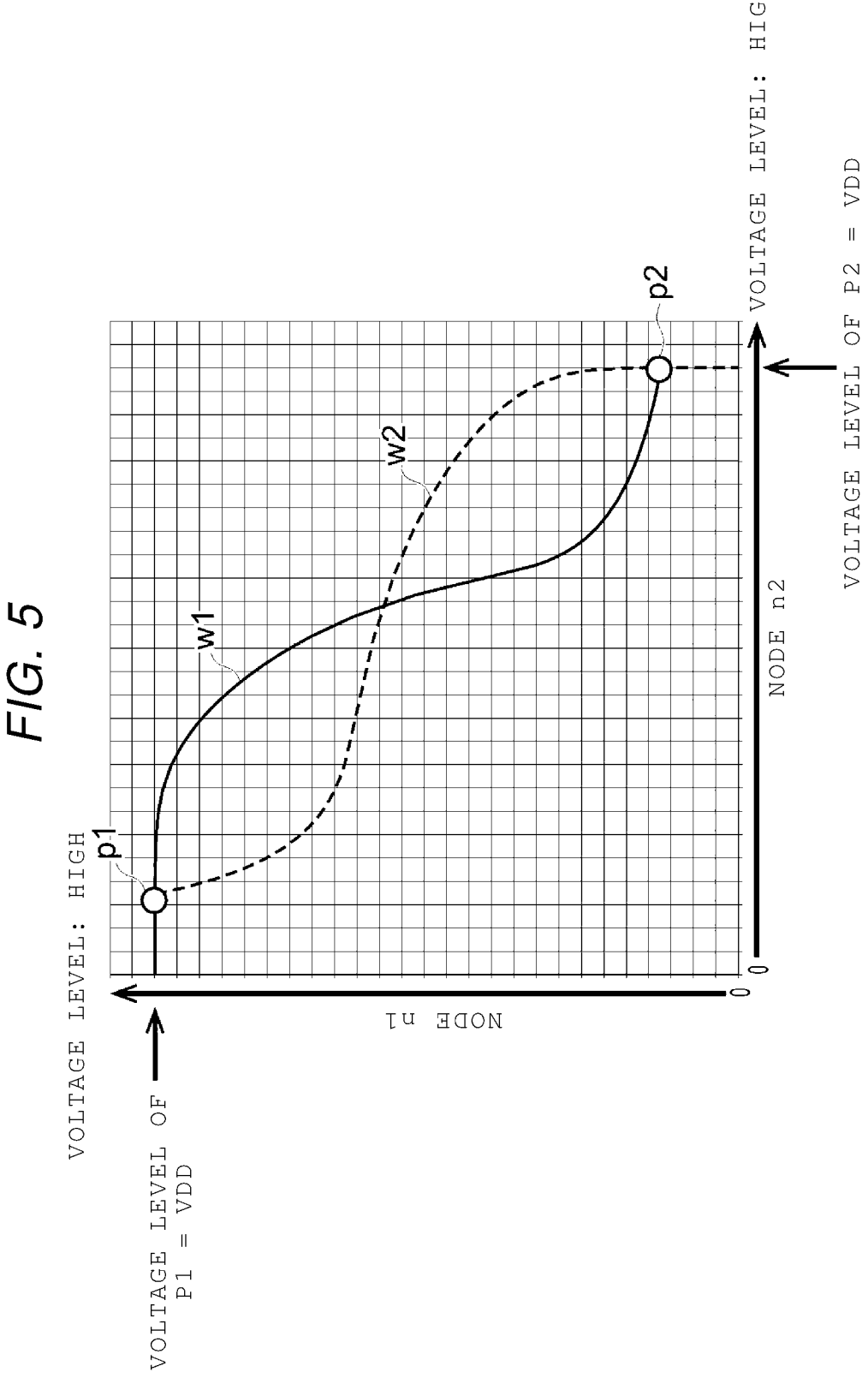
FIG. 5 is a diagram showing storage characteristics of the semiconductor storage device according to the first embodiment.

FIG. 5 is a diagram showing storage characteristics of the semiconductor storage device 1 according to the first embodiment. A horizontal axis in FIG. 5 is the voltage level of the node n2, and a vertical axis in FIG. 5 is the voltage level of the node n1. A curve w1 in FIG. 5 shows a change in the voltage level of the node n1 with respect to the voltage of the node n2, and a curve w2 shows a change in the voltage level of the node n2 with respect to the voltage of the node n1. As shown in FIG. 5, it can be seen that the nodes n1 and n2 are stable at two points p1 and p2 and have good storage characteristics. In the point p1, the voltage level of the node n1 is the power supply voltage VDD. In the point p2, the voltage level of the node n2 is the power supply voltage VDD.

Figure 6:
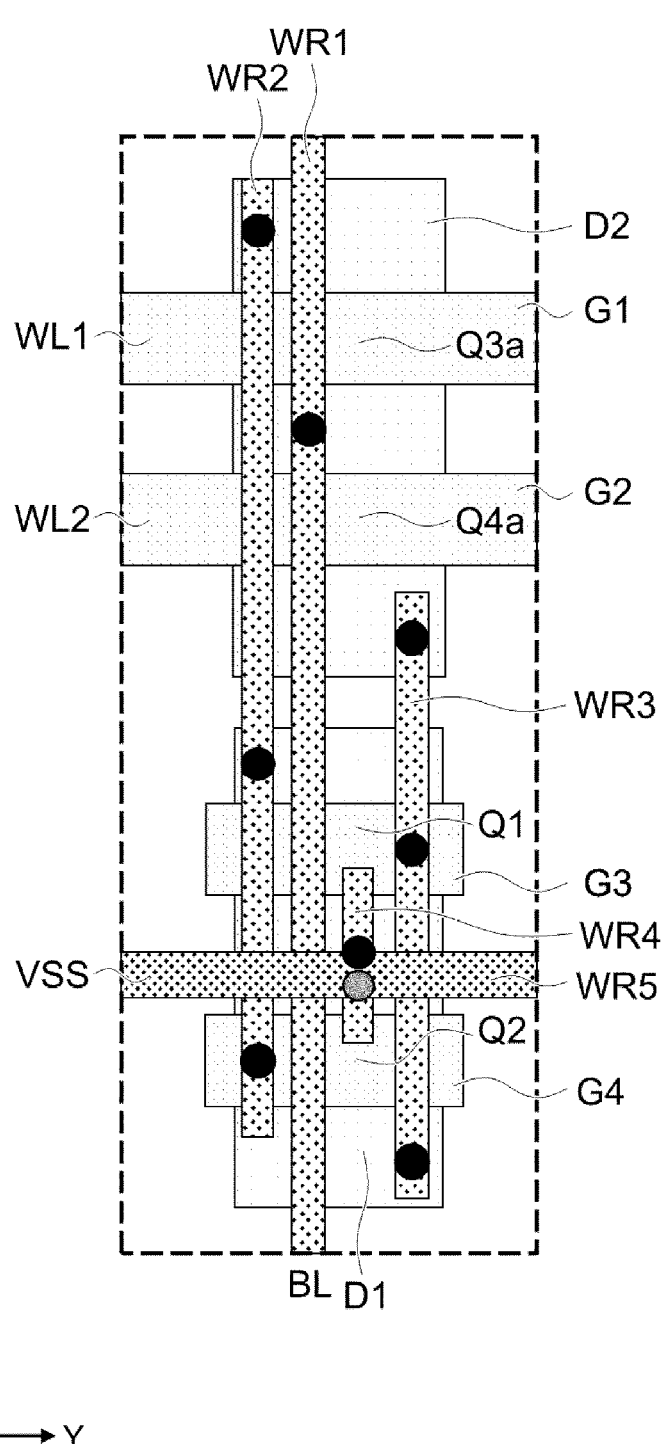
FIG. 6 is a layout diagram of the data latch circuit according to the first embodiment.
Figure 7:
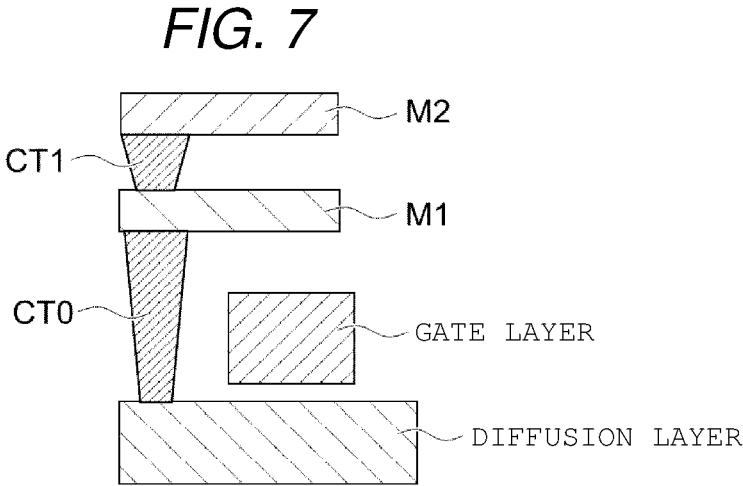
FIG. 7 is a cross-sectional view showing a stacking position of each layer in FIG. 6.

FIG. 6 is a layout diagram of the data latch circuit 10 according to the first embodiment, and FIG. 7 is a cross-sectional view showing a stacking position of each layer in FIG. 6. As shown in FIG. 7, the data latch circuit 10 according to the first embodiment is formed by stacking a plurality of layers having different layer heights, and includes a plurality of contacts CT0 and CT1 configured to electrically connect the respective layers. FIG. 6 shows a planar structure in which the plurality of layers having different layer heights are viewed in the stacking direction. The layout diagram and the cross-sectional view of the data latch circuit 10 according to the first embodiment are not necessarily limited to those shown in FIGS. 6 and 7. Black and gray circles in FIG. 6 represent the contacts.

In the examples of FIGS. 6 and 7, a first diffusion region D1 and a second diffusion region D2 are located in the lowest layer. The first diffusion region D1 and the second diffusion region D2 may be referred to as active regions. The first diffusion region D1 and the second diffusion region D2 are located apart from each other in a first direction X. A source region and a drain region of the transistors Q1 and Q2 are formed in the first diffusion region D1. A source region and a drain region of the transistors Q3a and Q4a are formed in the second diffusion region D2. The first diffusion region D1 and the second diffusion region D2 are formed by implanting impurity ions such as boron (B), phosphorus (P), and arsenic (As) into a semiconductor substrate and thermally diffusing the same therein.

A first gate layer G1 connected to the gate of the transistor Q3a and a second gate layer G2 connected to the gate of the transistor Q4a are located on the second diffusion region D2 via an insulating layer. A third gate layer G3 connected to the gate of the transistor Q1 and a fourth gate layer G4 connected to the gate of the transistor Q2 are located on the first diffusion region D1 via an insulating layer.

The first to fourth gate layers G1 to G4 are located at the same layer height. More specifically, each of the first to fourth gate layers G1 to G4 extends in a second direction Y. Further, the first to fourth gate layers G1 to G4 are located apart from each other in the first direction X.

A first metal layer M1 is located on the first to fourth gate layers G1 to G4 via an insulating layer. The first metal layer M1 is made of tungsten (W), copper (Cu), aluminum (Al), and the like. The first metal layer M1 includes a first wiring layer WR1, a second wiring layer WR2, a third wiring layer WR3, and a fourth wiring layer WR4, each of which extends in the first direction X. Here, the first to fourth wiring layers WR1 to WR4 are located apart from each other in the second direction Y.

The first wiring layer WR1 is the bit line BL connected to the drain of the transistor Q3a and the drain of the transistor Q4a. The second wiring layer WR2 is connected to the drain of the transistor Q1, the fourth gate layer G4, and the source of the transistor Q3a. The third wiring layer WR3 is connected to the drain of the transistor Q2, the third gate layer G3, and the source of the transistor Q4a.

The fourth wiring layer WR4 is connected to the source regions of the transistors Q1 and Q2 in the first diffusion region D1.

A second metal layer M2 is located on the first metal layer M1 via an insulating layer. The second metal layer M2 is made of tungsten (W), copper (Cu), aluminum (Al), and the like.

The second metal layer M2 has a fifth wiring layer WR5. The fifth wiring layer WR5 is set to the ground voltage VSS (first reference voltage). The fifth wiring layer WR5 is located above the first diffusion region D1 and extends in the second direction Y. The fifth wiring layer WR5 is connected to the fourth wiring layer WR4. Therefore, the fourth wiring layer WR4 is set to the ground voltage VSS. Further, since the fourth wiring layer WR4 is connected to the source regions of the transistors Q1 and Q2 in the first diffusion region D1, these source regions are also set to the ground voltage VSS.

The first diffusion region D1, the second diffusion region D2, the first to fourth gate layers G1 to G4, and the first to fourth wiring layers WR1 to WR4 in FIG. 6 are arranged line-symmetrically.

Figure 8:
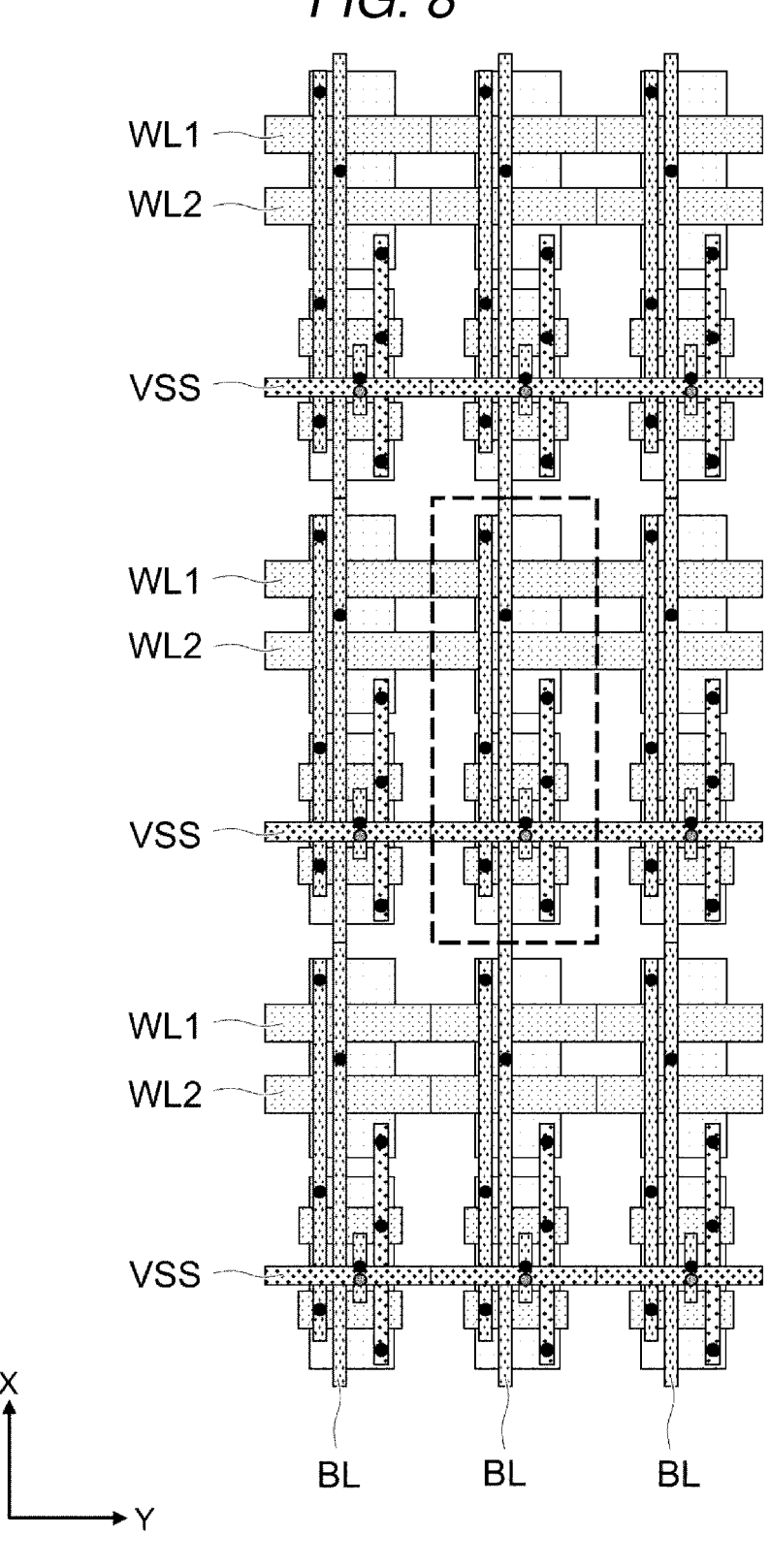
FIG. 8 is a layout diagram in which a plurality of data latch circuits having layout arrangement in FIG. 6 are located in a two-dimensional direction.

FIG. 8 is a layout diagram in which a plurality of data latch circuits 10 having the layout arrangement in FIG. 6 are located in the two-dimensional direction. In FIG. 8, the plurality of data latch circuits 10 having the layout arrangement in FIG. 6 are located in the first direction X and the second direction Y. The plurality of data latch circuits 10 located in the second direction Y share the word lines WL1 and WL2. The plurality of data latch circuits 10 located in the first direction X share the bit line BL.

The layout arrangements shown in FIGS. 6 and 8 are only examples, and various modifications thereof can be considered. For example, it is possible to adopt a point-symmetrical layout configuration.

Figure 9A:
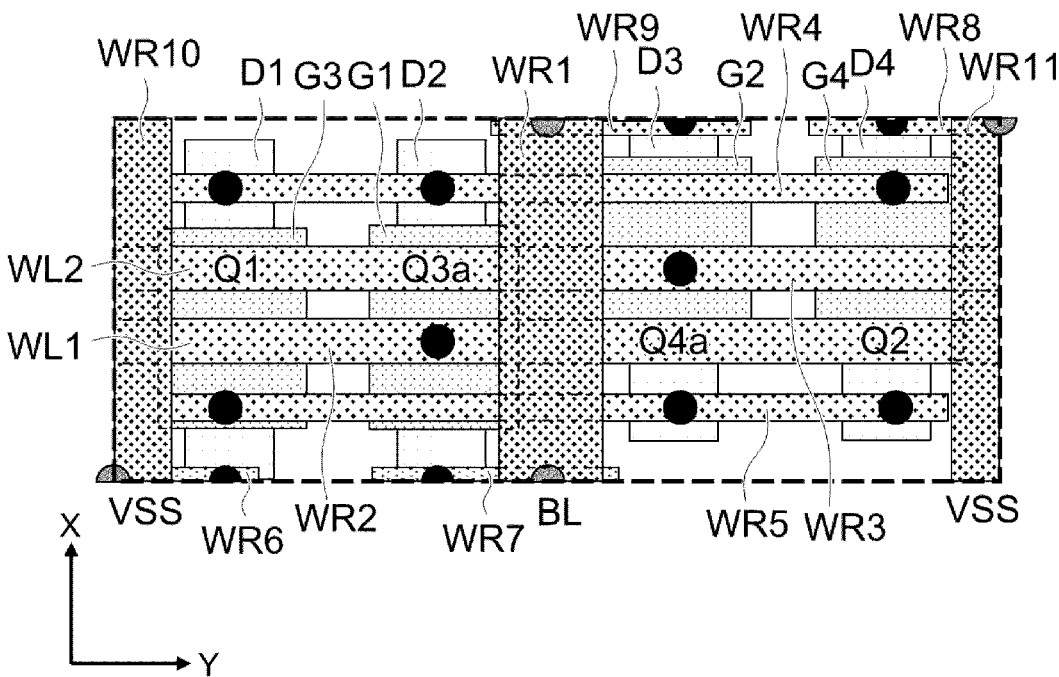
FIG. 9A is a layout diagram of a first modification of the data latch circuit according to the first embodiment.
Figure 9B:
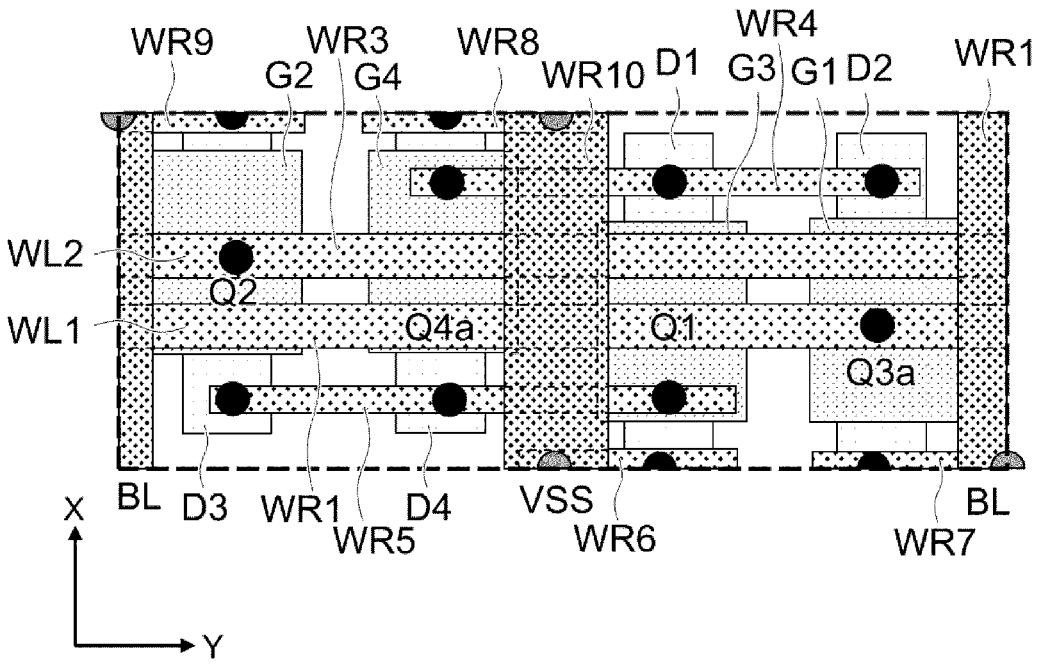
FIG. 9B is a diagram showing a configuration in which layout arrangement in FIG. 9A is shifted to the left or right by a half cycle.

FIG. 9A is a layout diagram of a first modification of the data latch circuit 10 according to the first embodiment, and FIG. 9B is a layout diagram of a second modification thereof. Both FIGS. 9A and 9B have a point-symmetrical layout arrangement with respect to a center position of a layout region. FIG. 9B has a configuration in which the layout arrangement in FIG. 9A is shifted to the left or right by a half cycle. In the following description, details of the layout arrangement in FIG. 9A will be described, and description of the layout arrangement in FIG. 9B will be omitted. A hierarchical relationship between the plurality of layers shown in FIGS. 9A and 9B is the same as that of FIG. 7.

In the layout arrangement in FIG. 9A, the first diffusion region D1, the second diffusion region D2, the third diffusion region D3, and the fourth diffusion region D4 are located apart from each other in the second direction Y in the lowest layer. Each of the first to fourth diffusion regions D1 to D4 extends in the first direction X. The first gate layer G1, the second gate layer G2, the third gate layer G3, and the fourth gate layer G4 are located apart from each other in the second direction Y above the first to fourth diffusion regions D1 to D4.

The first gate layer G1 overlaps the second diffusion region D2 in the stacking direction. The second gate layer G2 overlaps the third diffusion region D3 in the stacking direction. The third gate layer G3 overlaps the first diffusion region D1 in the stacking direction. The fourth gate layer G4 overlaps the fourth diffusion region D4 in the stacking direction.

The first metal layer M1 is located above the first to fourth gate layers G1 to G4. In the first metal layer M1, the second to ninth wiring layers WR2 to WR9 are located apart from each other in the first direction X. Each of the second to fifth wiring layers WR2 to WR5 extends in the second direction Y.

The second wiring layer WR2 is the word line WL1 and is connected to the first gate layer G1. The third wiring layer WR3 is the word line WL2 and is connected to the second gate layer G2. The fourth wiring layer WR4 is connected to the drain region of the transistor Q1 in the first diffusion region D1, the source region of the transistor Q3a in the second diffusion region D2, and the fourth gate layer G4. The fifth wiring layer WR5 is connected to the third gate layer G3, the source region of the transistor Q4a in the third diffusion region D3, and the drain region of the transistor Q2 in the fourth diffusion region D4. The sixth wiring layer WR6 is connected to the source region of the transistor Q1 in the first diffusion region D1. The seventh wiring layer WR7 is connected to the drain region of the transistor Q3a in the second diffusion region D2. The eighth wiring layer WR8 is connected to the drain region of the transistor Q2 in the fourth diffusion region D4. The ninth wiring layer WR9 is connected to the drain region of the transistor Q4a in the third diffusion region D3.

The second metal layer M2 is located above the first metal layer M1 that includes the second to fifth wiring layers WR2 to WR5. The second metal layer M2 includes a first wiring layer WR1, a tenth wiring layer WR10, and an eleventh wiring layer WR11. The first wiring layer WR1 is the bit line BL, and the tenth wiring layer WR10 and the eleventh wiring layer WR11 are wiring layers set to the ground voltage VSS.

The first wiring layer WR1 is located between the second diffusion region D2 and the third diffusion region D3. The tenth wiring layer WR10 is located close to the first diffusion region D1. The eleventh wiring layer WR11 is located close to the fourth diffusion region D4.

The first wiring layer WR1 is connected to the seventh wiring layer WR7 and is also connected to the ninth wiring layer WR9. The tenth wiring layer WR10 is connected to the sixth wiring layer WR6. The eleventh wiring layer WR11 is connected to the eighth wiring layer WR8.

Figure 10A:
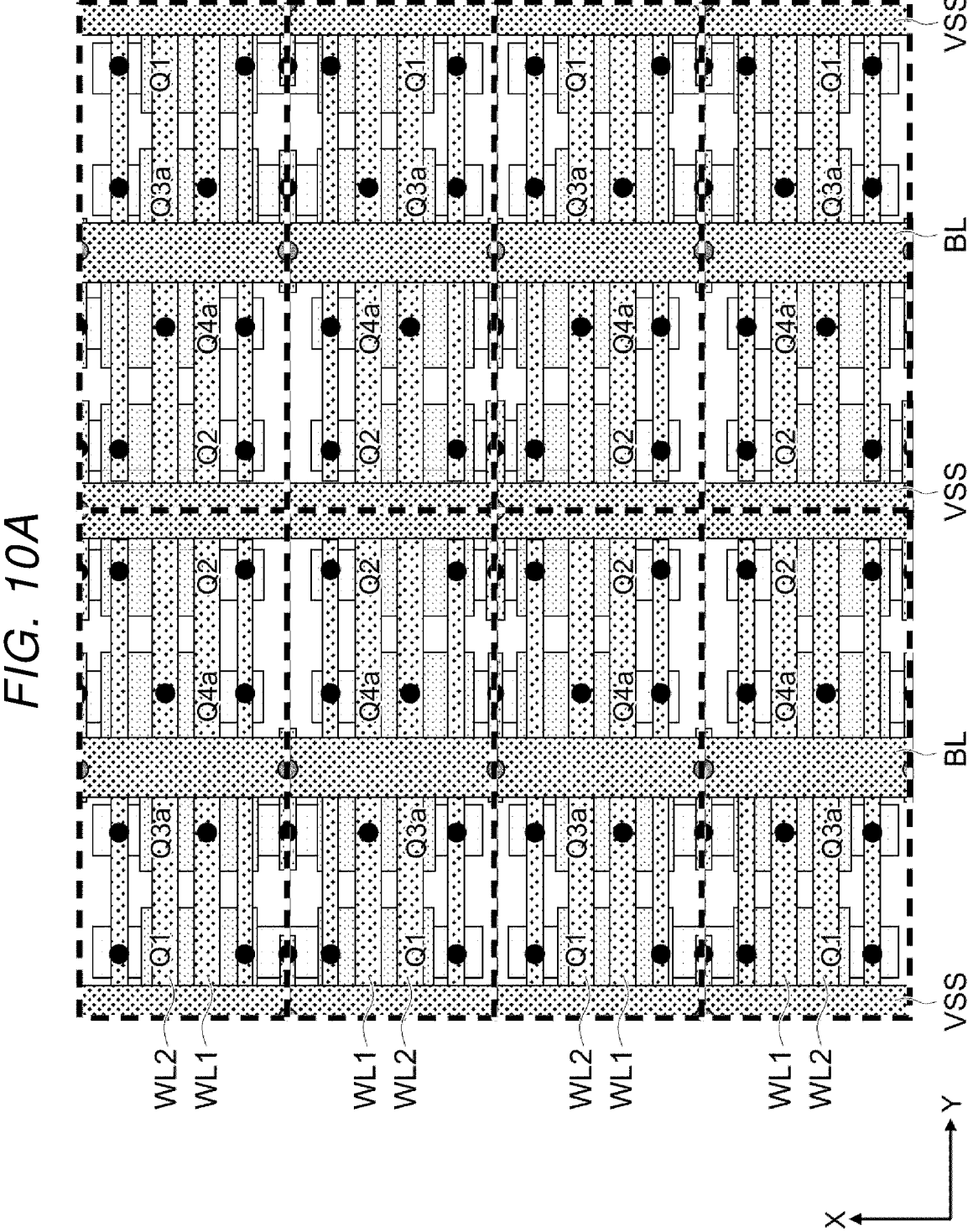
FIG. 10A is a layout diagram in which a plurality of data latch circuits having the layout arrangement in FIG. 9A are located in a first direction and a second direction.
Figure 10B:
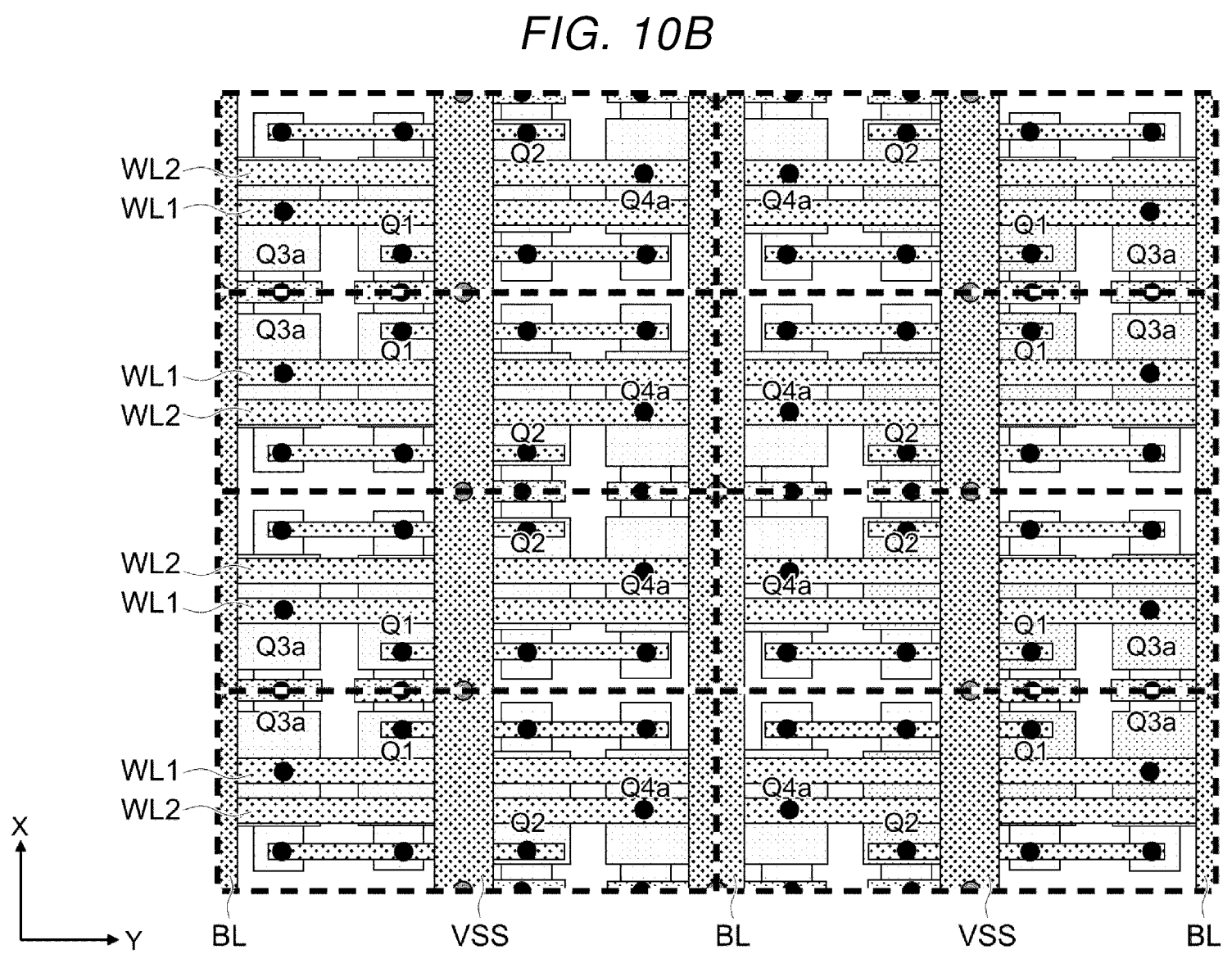

FIG. 10A is a layout diagram in which a plurality of data latch circuits 10 having the layout arrangement in FIG. 9A are located in the first direction X and the second direction Y. FIG. 10B is a layout diagram in which a plurality of data latch circuits 10 having the layout arrangement in FIG. 9B are located in the first direction X and the second direction Y.

Both FIGS. 10A and 10B have a point-symmetrical layout arrangement of the units of FIGS. 9A and 9B, and have a layout arrangement that is line-symmetric with respect to an axis extending in the second direction Y.

As described above, the data latch circuit 10 according to the first embodiment is formed of four transistors Q1, Q2, Q3a, and Q4a, thereby significantly reducing the circuit area thereof compared to the data latch circuit 100 according to the comparative example shown in FIG. 2. Data is stored in the nodes n1 and n2, and the voltage slightly lower than the power supply voltage VDD is applied to the word lines WL1 and WL2 during the data storage period, and as such, the data can be stably stored in the nodes n1 and n2 using the leakage current from the bit line BL. The data latch circuit 10 according to the first embodiment may be located in a line-symmetrical layout as shown in FIG. 6, and it is also possible to have a point-symmetrical layout arrangement as shown in FIG. 9A or FIG. 9B.

Second Embodiment

Although the data latch circuit 10 according to the first embodiment includes two word lines WL1 and WL2 and one bit line BL, each of which is connected to a corresponding component thereof, the same can also have a configuration including one word line WL and two bit lines BL and bBL, each of which is connected to a corresponding component thereof.

FIG. 11A is a diagram showing characteristics of a data latch circuit 10a according to a second embodiment, and FIG. 11B is a circuit diagram of the data latch circuit 10a according to the second embodiment.

One word line WL and two bit lines BL and bBL, each of which is connected to a corresponding component of the data latch circuit 10a, are provided in the data latch circuit 10a according to the second embodiment. The common word line WL is connected to the gates of the transistors Q3a and Q4a. The bit line BL is connected to the drain of the transistor Q3a, and the bit line bBL is connected to the drain of the transistor Q4a. The bit lines BL and bBL have logic levels that are inverted with respect to each other. A connection relationship between other transistors Q1 to Q4a is the same as that of FIGS. 3A and 3B.

FIG. 11C is a diagram showing the voltage of the word line WL, the bit line BL and bBL when the data latch circuit 10a in FIG. 11B reads data, writes the same, and stores the same.

When the data latch circuit 10a reads the data stored in the nodes n1 and n2, the word line WL is set to the ground voltage VSS (for example, 0 V). The bit lines BL and bBL are pre-charged to the power supply voltage VDD in advance. Accordingly, the data stored in the nodes n1 and n2 are read in the bit lines BL and bBL via the transistors Q3a and Q4a in the inverted logic.

When the data is written to the nodes n1 and n2, the word line WL is set to the ground voltage VSS (for example, 0 V). When the data to be written is 0, the bit line BL is set to the ground voltage VSS (for example, 0 V) and the bit line bBL is set to the power supply voltage VDD. Accordingly, the transistors Q1 and Q2 perform the operation of storing the data of "0". Meanwhile, when the data to be written is 1, the voltage levels of the bit lines BL and bBL are inverted to those in FIG. 11C.

When the data is stored in the nodes n1 and n2, the word line WL is set to voltage slightly lower than the power supply voltage VDD (for example, VDD×0.95–0.7 V), and the bit lines BL and bBL are set to the power supply voltage VDD.

Figure 12:
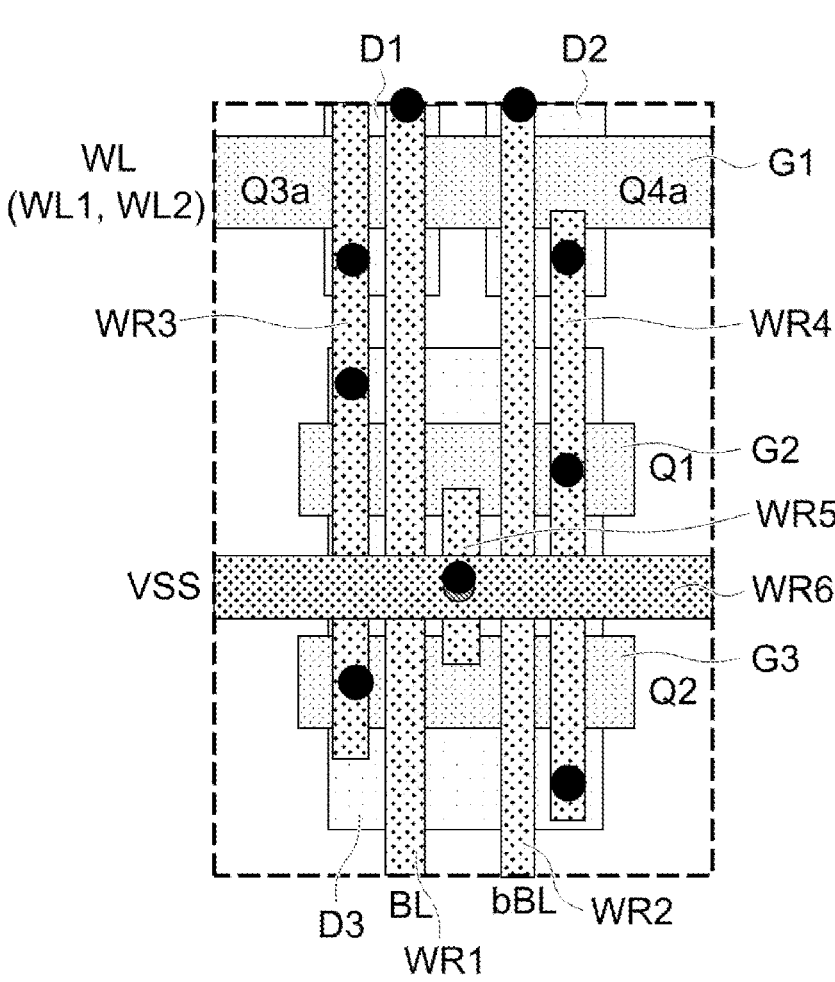
FIG. 12 is a layout diagram of the data latch circuit according to the second embodiment.
Figure 12:
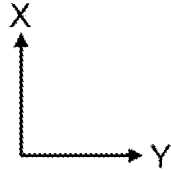

FIG. 12 is a layout diagram of the data latch circuit 10a according to the second embodiment. A hierarchical relationship between the plurality of layers shown in FIG. 12 is the same as that of FIG. 7.

In the layout arrangement in FIG. 12, the first diffusion region D1, the second diffusion region D2, and the third diffusion region D3 are located in the lowest layer. The first diffusion region D1 and the second diffusion region D2 are located apart from each other in the second direction Y. The third diffusion region D3 is located apart from the first diffusion region D1 and the second diffusion region D2 in the first direction X.

The first gate layer G1, the second gate layer G2, and the third gate layer G3 are located on the first to third diffusion regions D1 to D3. The first to third gate layers G1 to G3 are located at the same layer height. The first gate layer G1 is a word line. The first gate layer G1 overlaps the first diffusion region D1 and the second diffusion region D2 in the stacking direction. The first gate layer G1 is a layer connected to the gates of the transistors Q3a and Q4a.

The second gate layer G2 and the third gate layer G3 overlap the third diffusion region D3 in the stacking direction. The second gate layer G2 is a layer connected to the gate of the transistor Q1. The third gate layer G3 is a layer connected to the gate of the transistor Q2.

The first metal layer M1 is located on the first to third gate layers G1 to G3. The first metal layer M1 includes the first wiring layer WR1, the second wiring layer WR2, the third wiring layer WR3, the fourth wiring layer WR4, and the fifth wiring layer WR5. Here, the first to fifth wiring layers WR1 to WR5 respectively extend in the first direction X and are located apart from each other in the second direction Y.

The first wiring layer WR1 is the bit line BL, and the second wiring layer WR2 is the bit line bBL. The first wiring layer WR1 overlaps the first diffusion region D1 and the third diffusion region D3 in the stacking direction. The first wiring layer WR1 is connected to the drain region of the transistor Q3a in the first diffusion region D1. The second wiring layer WR2 overlaps the second diffusion region D2 and the third diffusion region D3 in the stacking direction. The second wiring layer WR2 is connected to the drain region of the transistor Q4a in the second diffusion region D2.

The third wiring layer WR3 overlaps the first diffusion region D1 and the third diffusion region D3 in the stacking direction. The third wiring layer WR3 is connected to the source region of the transistor Q3a in the first diffusion region D1, the drain region of the transistor Q1 in the third diffusion region D3, and the third gate layer G3.

The fourth wiring layer WR4 overlaps the second diffusion region D2 and the third diffusion region D3 in the stacking direction. The fourth wiring layer WR4 is connected to the source region of the transistor Q4a in the second diffusion region D2, the second gate layer G2 in the third diffusion region D3, and the drain region of the transistor Q2 in the third diffusion region D3.

The fifth wiring layer WR5 overlaps the third diffusion region D3 in the stacking direction. The fifth wiring layer WR5 is connected to the source regions of the transistors Q1 and Q2 in the third diffusion region D3.

The second metal layer M2 is located on the first to fifth wiring layers WR1 to WR5. The second metal layer M2 includes the sixth wiring layer WR6. The sixth wiring layer WR6 is set to the ground voltage VSS. The sixth wiring layer WR6 is connected to the fifth wiring layer WR5.

Figure 13:
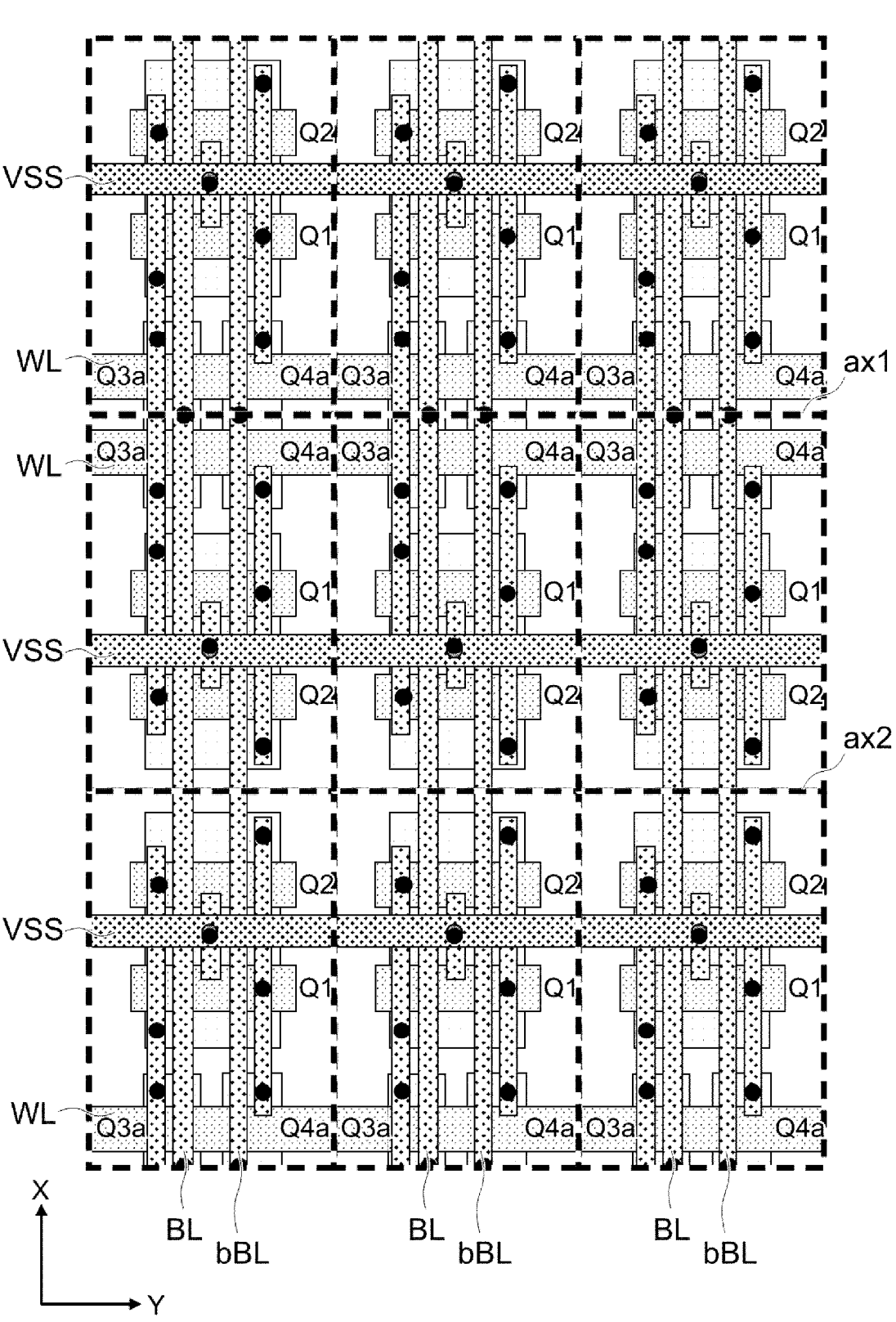
FIG. 13 is a layout diagram in which a plurality of data latch circuits having layout arrangement in FIG. 12 are located in the two-dimensional direction.

FIG. 13 is a layout diagram in which a plurality of data latch circuits 10a having the layout arrangement in FIG. 12 are located in the two-dimensional direction. In FIG. 13, the plurality of data latch circuits 10a are arranged line-symmetrically with respect to axes ax1 and ax2 extending in the second direction Y.

The layout arrangement shown in FIG. 12 is only an example, and various modifications thereof can be considered. For example, it is possible to adopt a point-symmetrical layout arrangement.

Figure 14A:
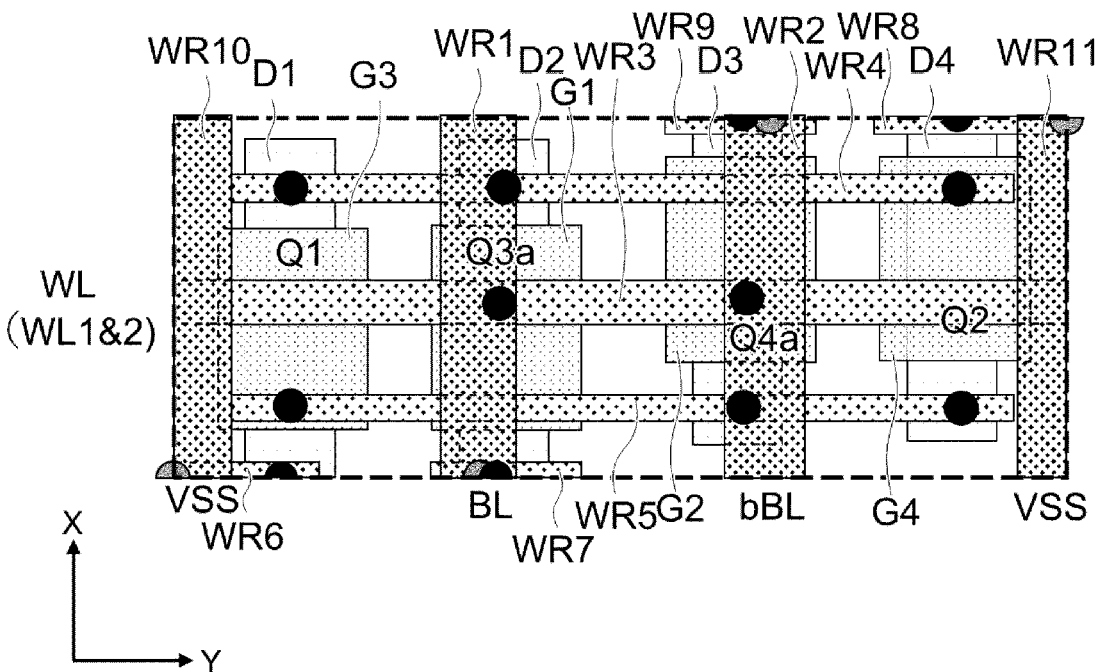
FIG. 14A is a layout diagram of a first modification of the data latch circuit according to the second embodiment.
Figure 14B:
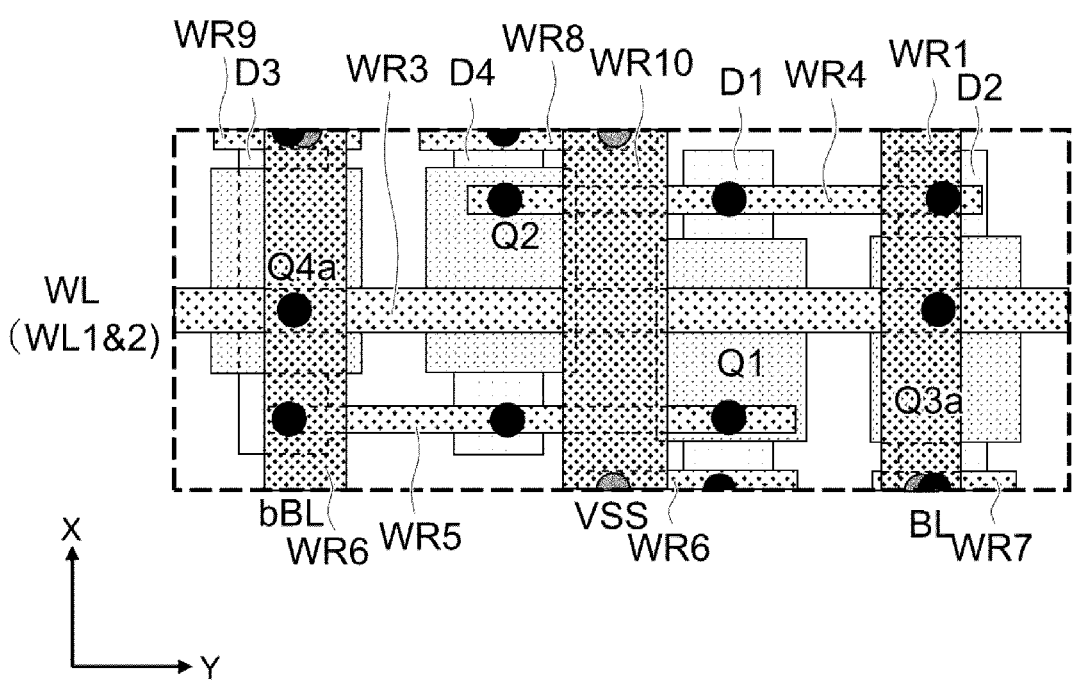
FIG. 14B is a layout diagram of a second modification.

FIG. 14A is a layout diagram of a first modification of the data latch circuit 10a according to the second embodiment, and FIG. 14B is a layout diagram of a second modification thereof. Both FIGS. 14A and 14B have a point-symmetrical layout arrangement with respect to the center position of the layout region. Hereinafter, details of the layout arrangement in FIG. 14A will be described, and description of the layout arrangement in FIG. 14B will be omitted. A hierarchical relationship between the plurality of layers shown in FIGS. 14A and 14B is the same as that of FIG. 7.

In the layout arrangement in FIG. 14A, the first diffusion region D1, the second diffusion region D2, the third diffusion region D3, and the fourth diffusion region D4 are located apart from each other in the second direction Y in the lowest layer. Each of the first to fourth diffusion regions D1 D4 extends in the first direction X. The first gate layer G1, the second gate layer G2, the third gate layer G3, and the fourth gate layer G4 are located apart from each other in the second direction Y on the first to fourth diffusion regions D1 to D4.

The first gate layer G1 overlaps the second diffusion region D2 in the stacking direction. The second gate layer G2 overlaps the third diffusion region D3 in the stacking direction. The third gate layer G3 overlaps the first diffusion region D1 in the stacking direction. The fourth gate layer G4 overlaps the fourth diffusion region D4 in the stacking direction.

The first metal layer M1 is located on the first to fourth gate layers G1 to G4. In the first metal layer M1, the third to ninth wiring layers WR3 to WR9 are located apart from each other in the first direction X. Each of the third to ninth wiring layers WR3 to WR9 extends in the second direction Y.

The third wiring layer WR3 is connected to the first gate layer G1 and the second gate layer G2. The fourth wiring layer WR4 is connected to the first diffusion region D1, the second diffusion region D2, and the fourth diffusion region D4. The fifth wiring layer WR5 is connected to the first diffusion region D1, the third diffusion region D3, and the fourth diffusion region D4. The sixth wiring layer WR6 is connected to the first diffusion region D1. The seventh wiring layer WR7 is connected to the second diffusion region D2. The eighth wiring layer WR8 is connected to the fourth diffusion region D4. The ninth wiring layer WR9 is connected to the third diffusion region D3.

The second metal layer M2 is located on the first metal layer M1 including the third to ninth wiring layers WR3 to WR9. In the second metal layer M2, the first wiring layer WR1, the second wiring layer WR2, the tenth wiring layer WR10, and the eleventh wiring layer WR11 are located apart from each other in the second direction Y. The first wiring layer WR1 is the bit line BL, and the second wiring layer WR2 is the bit line bBL. The tenth wiring layer WR10 and the eleventh wiring layer WR11 are layers set to the ground voltage VSS.

The tenth wiring layer WR10 is connected to the sixth wiring layer WR6. The first wiring layer WR1 is connected to the seventh wiring layer WR7. The eleventh wiring layer WR11 is connected to the eighth wiring layer WR8. The second wiring layer WR2 is connected to the ninth wiring layer WR9.

Figure 15A:
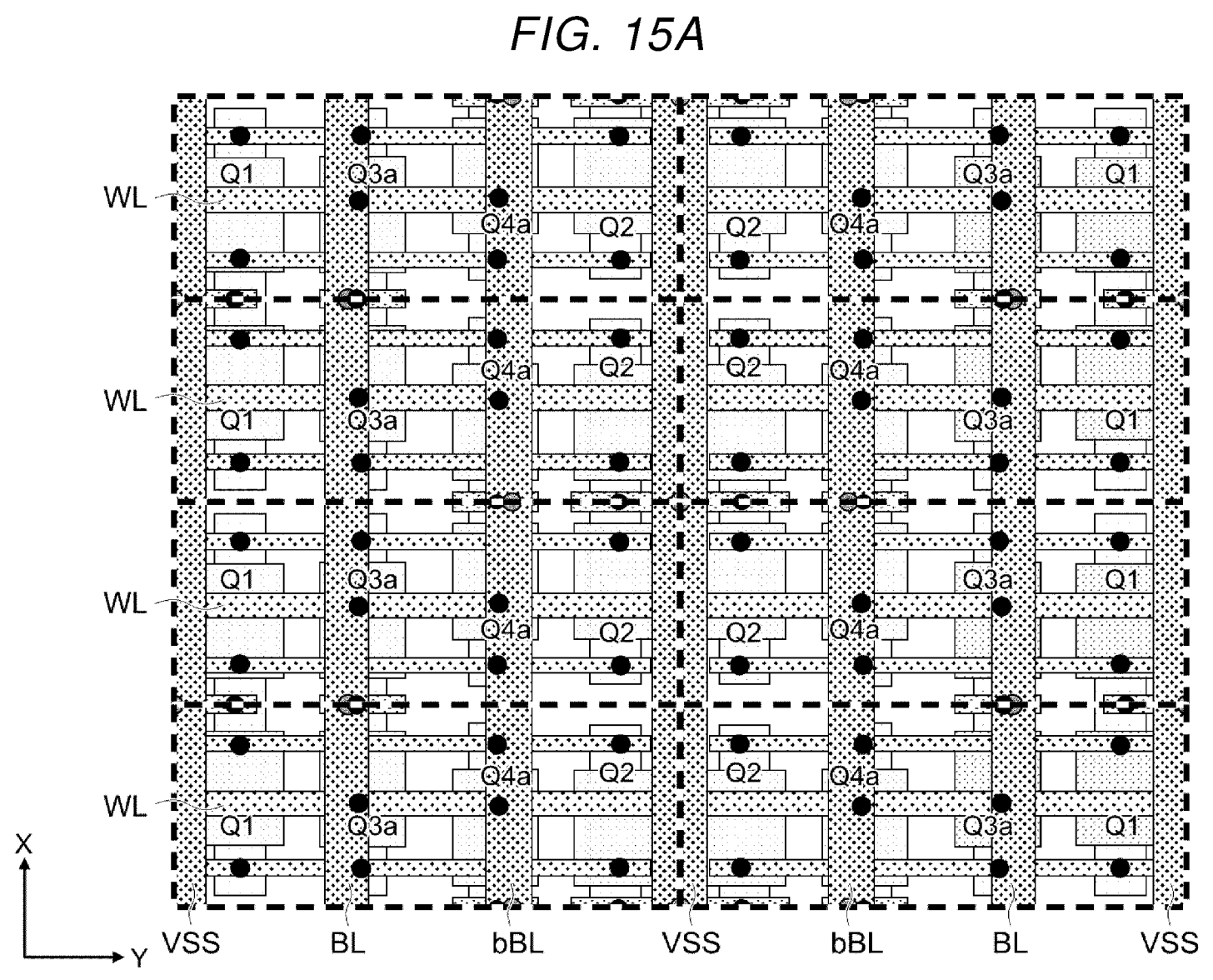
Figure 15B:
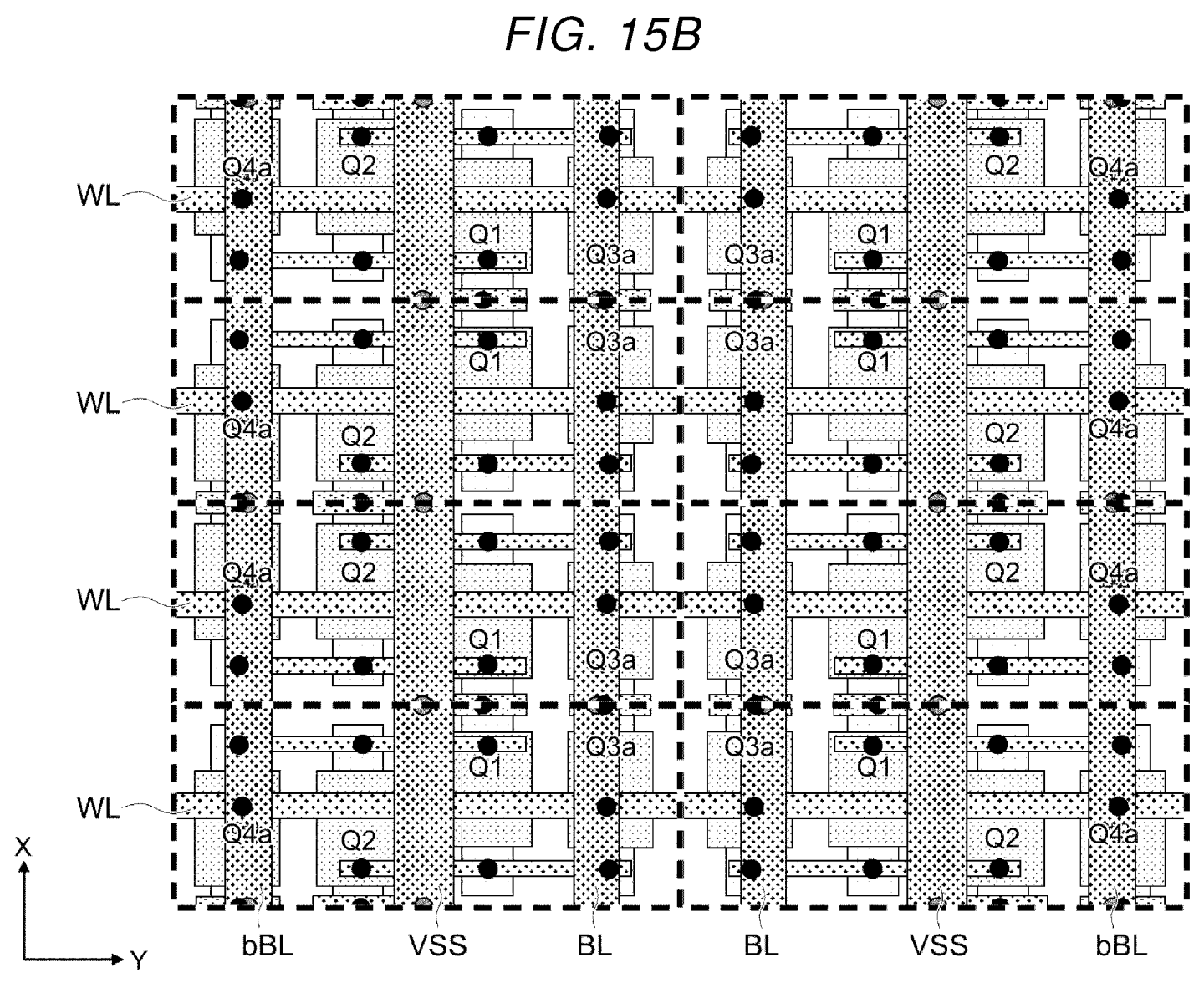

FIG. 15A is a layout diagram in which a plurality of data latch circuits 10a having the layout arrangement in FIG. 14A are located in the first direction X and the second direction Y. FIG. 15B is a layout diagram in which a plurality of data latch circuits 10*a* having the layout arrangement in FIG. 14B are located in the first direction X and the second direction Y.

Both FIGS. 15A and 15B have a point-symmetrical layout arrangement in the units of FIGS. 14A and 14B, and also have a line-symmetrical layout arrangement with respect to an axis extending in the second direction Y.

As described above, the data latch circuit 10*a* according to the second embodiment is formed of four transistors Q1 to Q4*a* in the same manner as that of the first embodiment, thereby significantly reducing the circuit area thereof compared to the data latch circuit 100 according to the comparative example shown in FIG. 2. The data latch circuit 10*a* according to the second embodiment may have the point-symmetrical layout arrangement as shown in FIG. 12, or may have the line-symmetrical layout arrangement as shown in FIG. 14A or FIG. 14B.

Third Embodiment

In the first and second embodiments described above, the data latch circuit 10 including four transistors Q1 to Q4*a* is described. Here, it is also possible to provide a data latch circuit 10*b* including six transistors. Two additional transistors determine whether to supply the power supply voltage VDD to the data latch circuit 10*b*. That is, the two additional transistors make it possible to determine whether the data latch circuit 10*b* performs the data storage operation or the data read operation.

FIG. 16A is a diagram showing characteristics of the data latch circuit 10*b* according to a third embodiment, and FIG. 16B is a circuit diagram of the data latch circuit 10*b* according to the third embodiment. The data latch circuit 10*b* according to the third embodiment has a configuration in which the second transistor group 22 including the transistors Q7 and Q8 is omitted from the data latch circuit 100 according to the comparative example in FIG. 2. The transistors Q1 to Q4 are NMOS transistors, and the transistors Q5 and Q6 are PMOS transistors.

As shown in FIG. 16B, the source of the transistor Q5 is connected to the power supply voltage VDD node. The drain of the transistor Q5 is connected to the drain of the transistor Q1, the gate of the transistor Q2, and the drain of the transistor Q3. The source of the transistor Q6 is connected to the power supply voltage VDD node, and the drain of the transistor Q6 is connected to the drain of the transistor Q2, the gate of the transistor Q1, and the drain of the transistor Q4.

The common control signal Vctl is input to the gates of the transistors Q5 and Q6. In the data storage operation, Vctl is set to a voltage level slightly lower than the power supply voltage VDD. The voltage level slightly lower than the power supply voltage VDD is, for example, a voltage level lower than the power supply voltage VDD by 5 to 30%. The reason for setting the gate voltage Vctl of the transistors Q5 and Q6 to the voltage level slightly lower than the power supply voltage VDD during the data storage period is to allow leakage current to flow through the transistors Q5 and Q6.

From the data storage state, one of the word lines WL1 and WL2 is set to a high level and the other one is set to a low level, thereby making it possible to turn on one of the transistor Q3 and Q4 and to read the state of either the node n1 or the node n2 in the bit line.

When a high-level control signal is input to the gates of the transistors Q5 and Q6, the transistors Q5 and Q6 are turned OFF. In this state, one of the word lines WL1 and WL2 is set to the high level and the other one is set to the low level, thereby making it possible to turn on one of the transistors Q3 and Q4 and to write data of the bit line to the node n1 and the node n2.

When a low-level control signal is input to the gates of the transistors Q5 and Q6, the transistors Q5 and Q6 are turned ON, and the drains of the transistors Q1 and Q2 become the power supply voltage VDD. This operation can also be used as a function of initializing the states of the node n1 and the node n2.

FIG. 16C is a diagram showing the voltage of the word lines WL1 and WL2, the bit line BL, and the control signal Vctl when the data latch circuit 10*b* in FIG. 16B reads data, writes the same, and stores the same. FIG. 16C shows an example in which the word line WL1 is accessed. When the word line WL2 is accessed, a voltage relationship between the word lines WL1 and WL2 in FIG. 16C is inverted.

When the data latch circuit 10*b* reads the data stored in the nodes n1 and n2 via the transistor Q3, the word line WL1 is set to the power supply voltage VDD and the word line WL2 is set to the ground voltage VSS. Further, the bit line BL is pre-charged to the power supply voltage VDD in advance. Additionally, the control signal Vctl is set to voltage slightly lower than the power supply voltage VDD (for example, VDD×0.95–0.7). Accordingly, the data stored in the nodes n1 and n2 are read in the bit line BL via the transistor Q3.

When the data latch circuit 10*b* writes the data to the nodes n1 and n2 via the transistor Q3, the word line WL1 is set to the power supply voltage VDD, and the word line WL2 is set to the ground voltage VSS (for example, 0 V). When the data to be written is 0, the bit line BL is set to the ground voltage VSS (for example, 0 V). Further, the control signal Vctl is set to the power supply voltage VDD. Accordingly, the data of "0" is stored in the nodes n1 and n2 via the transistor Q3. Meanwhile, when the data to be written is 1, the bit line BL is set to the power supply voltage VDD.

When the data latch circuit 10*b* stores the data in the nodes n1 and n2, the word lines WL1 and WL2 are set to voltage slightly lower than the power supply voltage VDD (for example, VDD×0.95–0.7 V), and the bit line BL is set to the power supply voltage VDD. Additionally, the control signal Vctl is set to voltage slightly lower than the power supply voltage VDD (for example, VDD×0.95–0.7 V).

Figure 17:
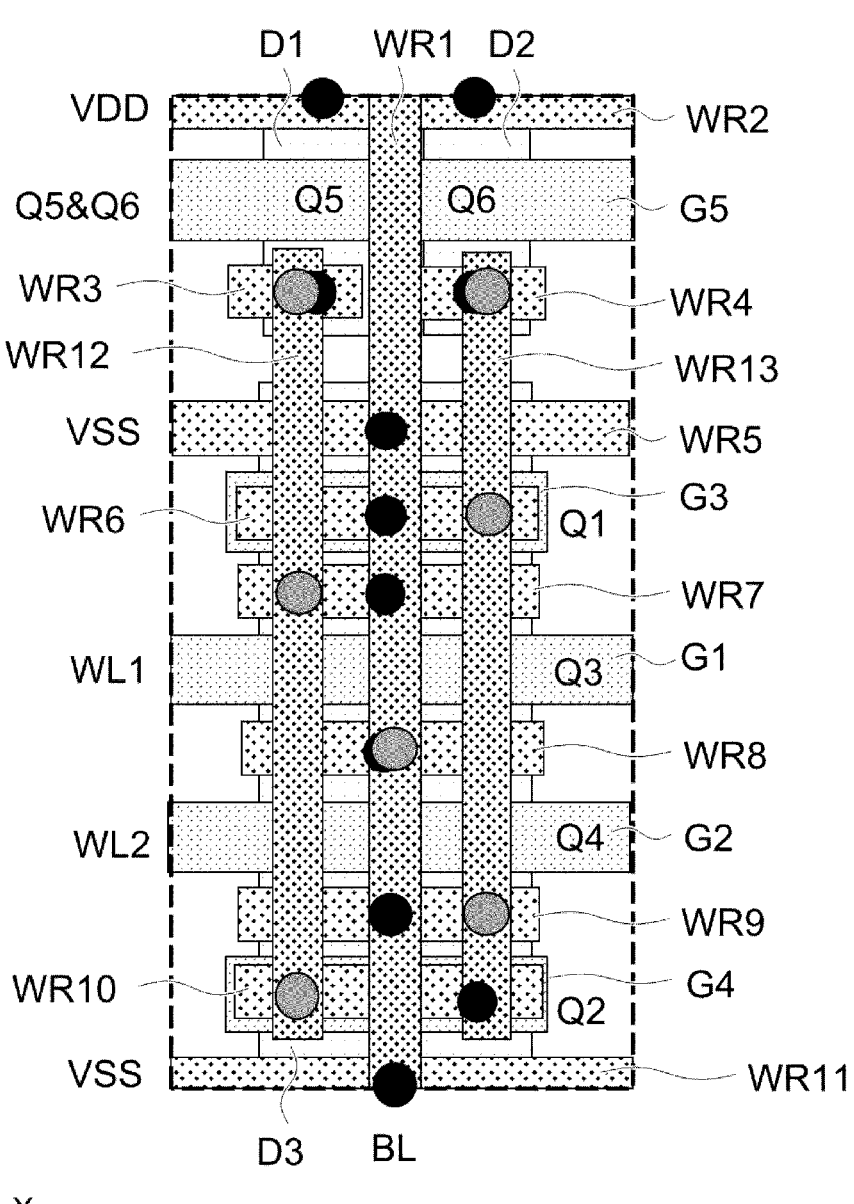
FIG. 17 is a layout diagram of the data latch circuit according to the third embodiment.
Figure 17:
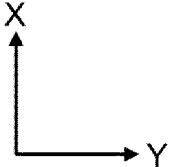

FIG. 17 is a layout diagram of the data latch circuit 10*b* according to the third embodiment. The third embodiment has a configuration in which a plurality of layers having different layer heights are stacked with each other, and a plurality of contacts configured to electrically connect the respective layers are provided. A hierarchical relationship between the respective layers forming the data latch circuit 10*b* in FIG. 17 is the same as that of FIG. 7.

In the layout arrangement in FIG. 17, the first diffusion region D1, the second diffusion region D2, and the third diffusion region D3 are located in the lowest layer. The first diffusion region D1 and the second diffusion region D2 are located apart from each other in the second direction Y. The third diffusion region D3 is located apart from the first diffusion region D1 and the second diffusion region D2 in the first direction X.

The first gate layer G1, the second gate layer G2, the third gate layer G3, the fourth gate layer G4, and the fifth gate layer G5 are located on the first to third diffusion regions D1 to D3. The first to fifth gate layers G1 to G5 extend in the second direction Y, are located apart from each other in the first direction X, and are located at the same layer height.

The first gate layer G1 is the word line WL1 and is connected to the gate of the transistor Q3. The first gate layer G1 overlaps the third diffusion region D3 in the stacking direction. The second gate layer G2 is the word line WL2 and is connected to the gate of the transistor Q4. The second gate layer G2 overlaps the third diffusion region D3 in the stacking direction.

The third gate layer G3 is connected to the gate of the transistor Q1. The fourth gate layer G4 is connected to the gate of the transistor Q2. The fifth gate layer G5 is connected to the gates of the transistors Q5 and Q6.

The second to eleventh wiring layers WR2 to WR11 are located on the first to fifth gate layers G1 to G5. The second to eleventh wiring layers WR2 to WR11 extend in the second direction Y, and are located apart from each other in the first direction X.

The second wiring layer WR2 is a layer set to the power supply voltage (second reference voltage) VDD. The third wiring layer WR3 is connected to the drain region of the transistor Q5 in the first diffusion region D1. The fourth wiring layer WR4 is connected to the drain region of the transistor Q6 in the second diffusion region D2. The third wiring layer WR3 and the fourth wiring layer WR4 are located apart from each other in the second direction Y.

The fifth wiring layer WR5 is a layer set to the ground voltage VSS. The sixth wiring layer WR6 is connected to the gate of the transistor Q1. The seventh wiring layer WR7 is connected to the source region of the transistor Q3 in the third diffusion region D3. The eighth wiring layer WR8 is connected to the first wiring layer WR1. The ninth wiring layer WR9 is connected to the drain region of the second transistor in the third diffusion region D3. The tenth wiring layer WR10 is connected to a twelfth wiring layer WR12. The eleventh wiring layer WR11 is a layer set to the ground voltage VSS.

The first wiring layer WR1, the twelfth wiring layer WR12, and a thirteenth wiring layer WR13 are located on the second to eleventh wiring layers WR2 to WR11. The first wiring layer WR1, the twelfth wiring layer WR12, and the thirteenth wiring layer WR13 extend in the first direction X and are located apart from each other in the second direction Y.

The first wiring layer WR1 is the bit line BL and is connected to the eighth wiring layer WR8. The twelfth wiring layer WR12 is connected to the third wiring layer WR3, the seventh wiring layer WR7, and the tenth wiring layer WR10. The thirteenth wiring layer WR13 is connected to the fourth wiring layer WR4, the sixth wiring layer WR6, and the ninth wiring layer WR9.

Figure 18:
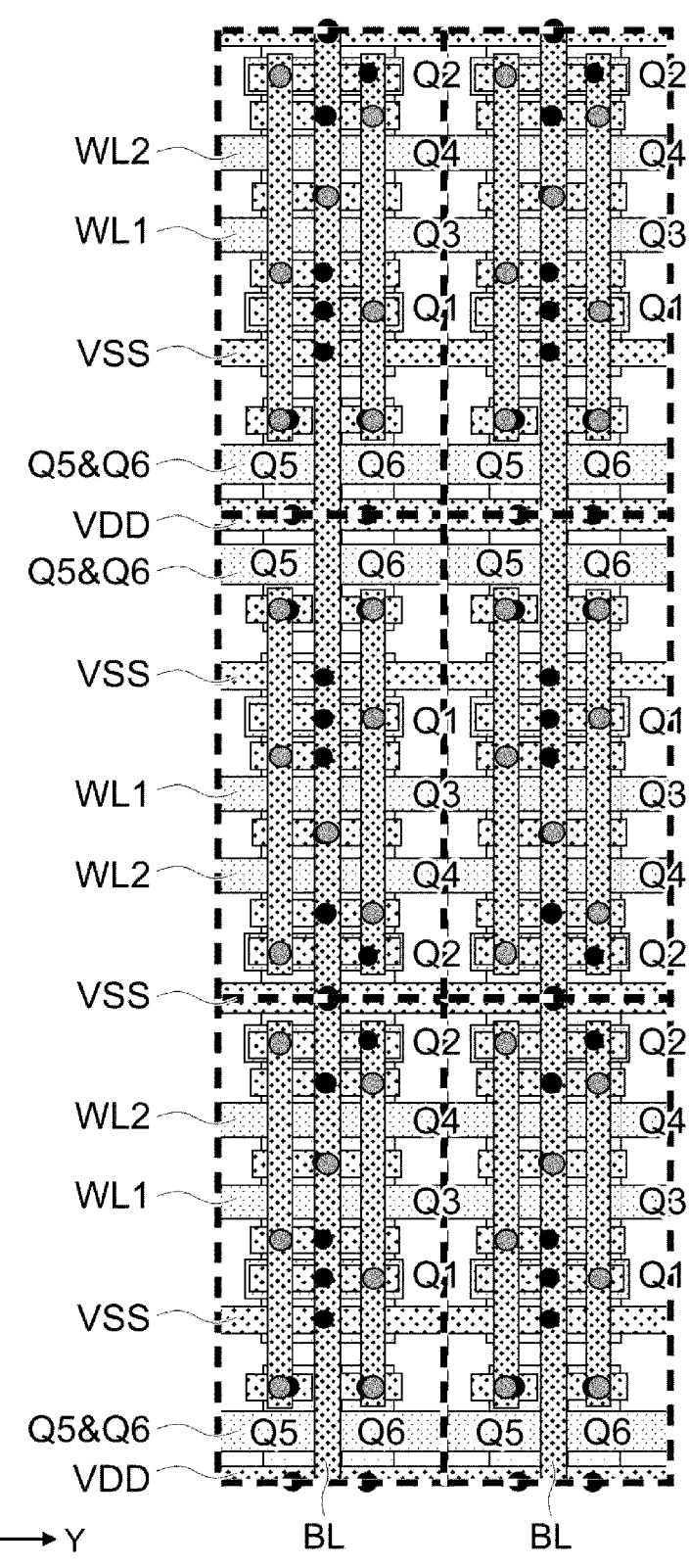
FIG. 18 is a layout diagram in which a plurality of data latch circuits having layout arrangement in FIG. 17 are located in the two-dimensional direction.

FIG. 18 is a layout diagram in which a plurality of data latch circuits 10b having the layout arrangement in FIG. 17 are located in the two-dimensional direction. In FIG. 18, the plurality of data latch circuits 10b are located line-symmetrically with respect to an axis extending in the second direction Y.

The layout arrangement shown in FIG. 17 is only an example, and various modifications thereof can be considered. For example, it is also possible to adopt a point-symmetrical layout arrangement.

As described above, the data latch circuit 10b according to the third embodiment is formed of six transistors Q1 to Q6, thereby making it possible to reduce the circuit area thereof compared to the data latch circuit 100 according to the comparative example shown in FIG. 2. Additionally, unlike in the first and second embodiments, it is not required to set the voltage of the word line to the voltage slightly lower than the power supply voltage VDD during the data storage period, and as such, the voltage control of the word line becomes easy.

Fourth Embodiment

Although the data latch circuit 10b according to the third embodiment includes two word lines WL1 and WL2 and one bit line BL, each of which is connected to a corresponding component thereof, the same may also have a configuration including one word line WL and two bit lines BL and bBL, each of which is connected to a corresponding component thereof.

FIG. 19A is a diagram showing characteristics of a data latch circuit 10c according to a fourth embodiment, and FIG. 19B is a circuit diagram of the data latch circuit 10c according to the fourth embodiment.

The data latch circuit 10c according to the fourth embodiment includes one word line WL and two bit lines BL and bBL, each of which is connected to a corresponding component thereof. The common word line WL is connected to the gates of the transistors Q3 and Q4. The bit line BL is connected to the drain of the transistor Q3, and the bit line bBL is connected to the drain of the transistor Q4. The bit lines BL and bBL are mutually inverted logics. A connection relationship between other transistors Q1 to Q4 is the same as that of FIGS. 3A and 3B.

FIG. 19C is a diagram showing the voltage of the word line WL, the bit lines BL and bBL, and the control signal Vctl when the data latch circuit 10c in FIG. 19B reads data, writes the same, and stores the same.

When the data latch circuit 10c reads the data stored in the nodes n1 and n2, the word line WL is set to the power supply voltage VDD. The bit lines BL and bBL are pre-charged to the power supply voltage VDD in advance. Further, the control signal Vctl is set to voltage slightly lower than the power supply voltage VDD (for example, VDD×0.95–0.7 V). Accordingly, the data stored in the nodes n1 and n2 are read in the bit lines BL and bBL via the transistors Q3 and Q4 in the inverted logic.

When the data latch circuit 10c writes the data to the nodes n1 and n2, the word line WL is set to the power supply voltage VDD. When the data to be written is 0, the bit line BL is set to the ground voltage VSS (for example, 0 V) and the bit line bBL is set to the power supply voltage VDD. The control signal Vctl is set to the power supply voltage VDD. Accordingly, the transistors Q1 and Q2 perform the operation of storing the data of "0". Meanwhile, when the data to be written is 1, the voltage levels of the bit lines BL and bBL are inverted to those in FIG. 19C.

When the data latch circuit 10c stores the data in the nodes n1 and n2, the word line WL is set to the ground voltage VSS (for example, 0 V), and the bit lines BL and bBL are set to the power supply voltage VDD. Further, the control signal Vctl is set to voltage slightly lower than the power supply voltage VDD (for example, VDD×0.95–0.7 V).

Figure 20:
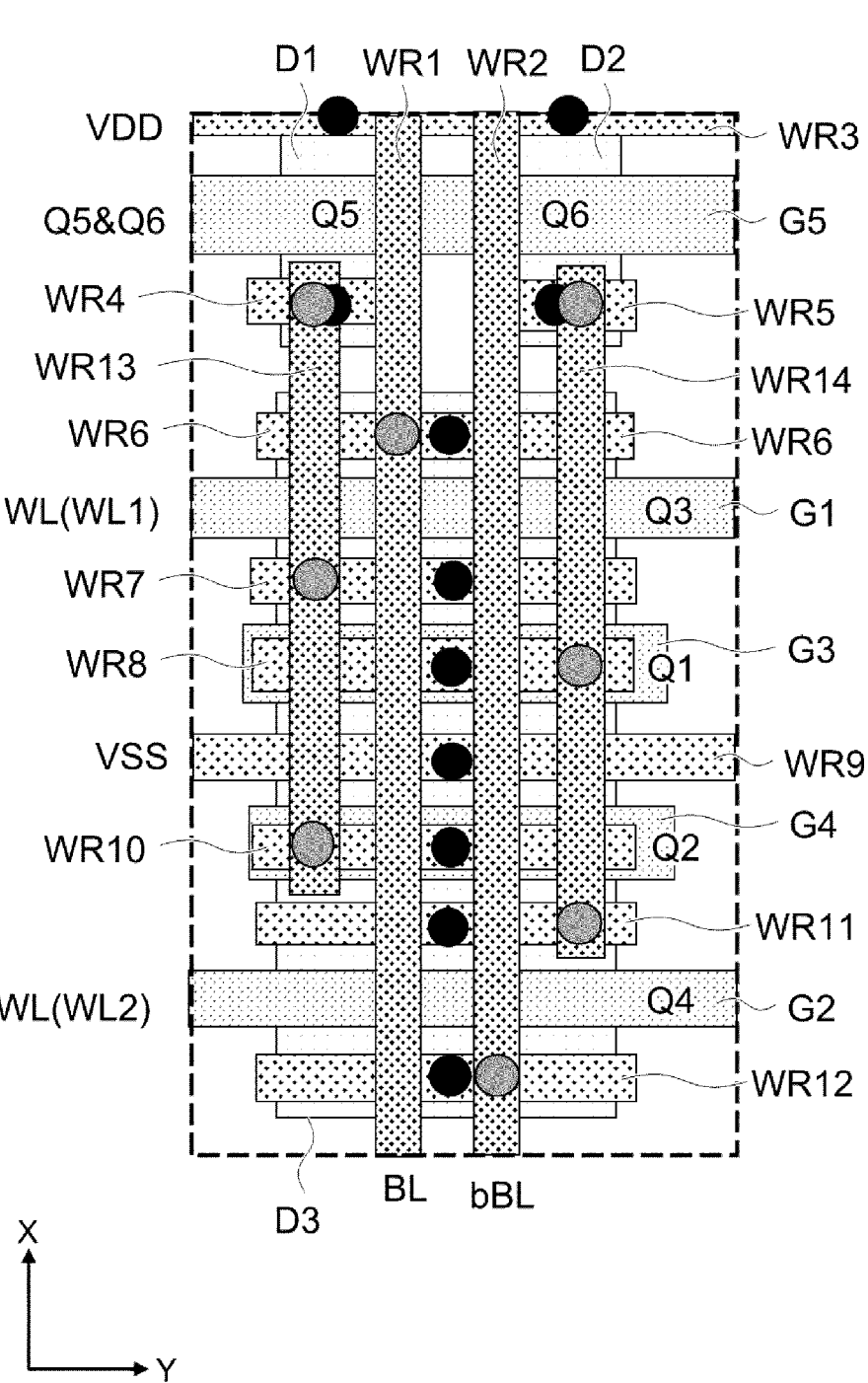
FIG. 20 is a layout diagram of the data latch circuit according to the fourth embodiment.

FIG. 20 is a layout diagram of the data latch circuit 10c according to the fourth embodiment. A hierarchical relationship between the plurality of layers shown in FIG. 20 is the same as that of FIG. 7.

In the layout arrangement in FIG. 20, the first diffusion region D1, the second diffusion region D2, and the third diffusion region D3 are located in the lowest layer. The first diffusion region D1 and the second diffusion region D2 are located apart from each other in the second direction Y. The third diffusion region D3 is located apart from the first diffusion region D1 and the second diffusion region D2 in the first direction X.

The first gate layer G1, the second gate layer G2, the third gate layer G3, the fourth gate layer G4, and the fifth gate layer G5 are located on the first to third diffusion regions D1 to D3. The first to fifth gate layers G1 to G5 extend in the second direction Y, are located apart from each other in the first direction X at the same layer height.

The first gate layer G1 is the word line WL and is connected to the gate of the transistor Q3. The first gate layer G1 overlaps the third diffusion region D3 in the stacking direction. The second gate layer G2 is also the word line WL and is connected to the gate of the transistor Q4. The second gate layer G2 is the word line WL and overlaps the third diffusion region D3 in the stacking direction. Since the first gate layer G1 and the second gate layer G2 have the same word line WL, the first gate layer G1 and the second gate layer G2 may be integrated into one gate layer.

The third gate layer G3 is connected to the gate of the transistor Q1. The fourth gate layer G4 is connected to the gate of the transistor Q2. The fifth gate layer G5 is connected to the gates of the transistors Q5 and Q6.

The third to twelfth wiring layers WR3 to WR12 are located on the first to fifth gate layers G1 to G5. The third to twelfth wiring layers WR3 to WR12 extend in the second direction Y and are located apart from each other in the first direction X.

The third wiring layer WR3 is a layer set to the power supply voltage VDD. The fourth wiring layer WR4 is connected to the drain region of the transistor Q5 in the first diffusion region D1. The fifth wiring layer WR5 is connected to the drain region of the transistor Q6 in the second diffusion region D2. The fourth wiring layer WR4 and the fifth wiring layer WR5 are located apart from each other in the second direction Y.

The sixth wiring layer WR6 is connected to the source region of the transistor Q3 in the third diffusion region D3. The seventh wiring layer WR7 is connected to the drain region of the transistor Q3 in the third diffusion region D3. The eighth wiring layer WR8 is connected to the gate of the transistor Q1. The ninth wiring layer WR9 is a layer set to the ground voltage VSS. The tenth wiring layer WR10 is connected to the gate of the transistor Q2. The eleventh wiring layer WR11 is connected to the drain region of the transistor Q4 in the third diffusion region D3. The twelfth wiring layer WR12 is connected to the source region of the transistor Q4 in the third diffusion region D3.

The first wiring layer WR1, the second wiring layer WR2, the thirteenth wiring layer WR13, and a fourteenth wiring layer WR14 are located on the third to twelfth wiring layers WR3 to WR12. The first wiring layer WR1, the second wiring layer WR2, the thirteenth wiring layer WR13, and the fourteenth wiring layer WR14 extend in the first direction X, and are located apart from each other in the second direction Y.

The first wiring layer WR1 is the bit line BL and is connected to the sixth wiring layer WR6. The second wiring layer WR2 is the bit line bBL and is connected to the twelfth wiring layer WR12. The thirteenth wiring layer WR13 is connected to the fourth wiring layer WR4, the seventh wiring layer WR7, and the tenth wiring layer WR10. The fourteenth wiring layer WR14 is connected to the fifth wiring layer WR5, the eighth wiring layer WR8, and the eleventh wiring layer WR11.

Figure 21:
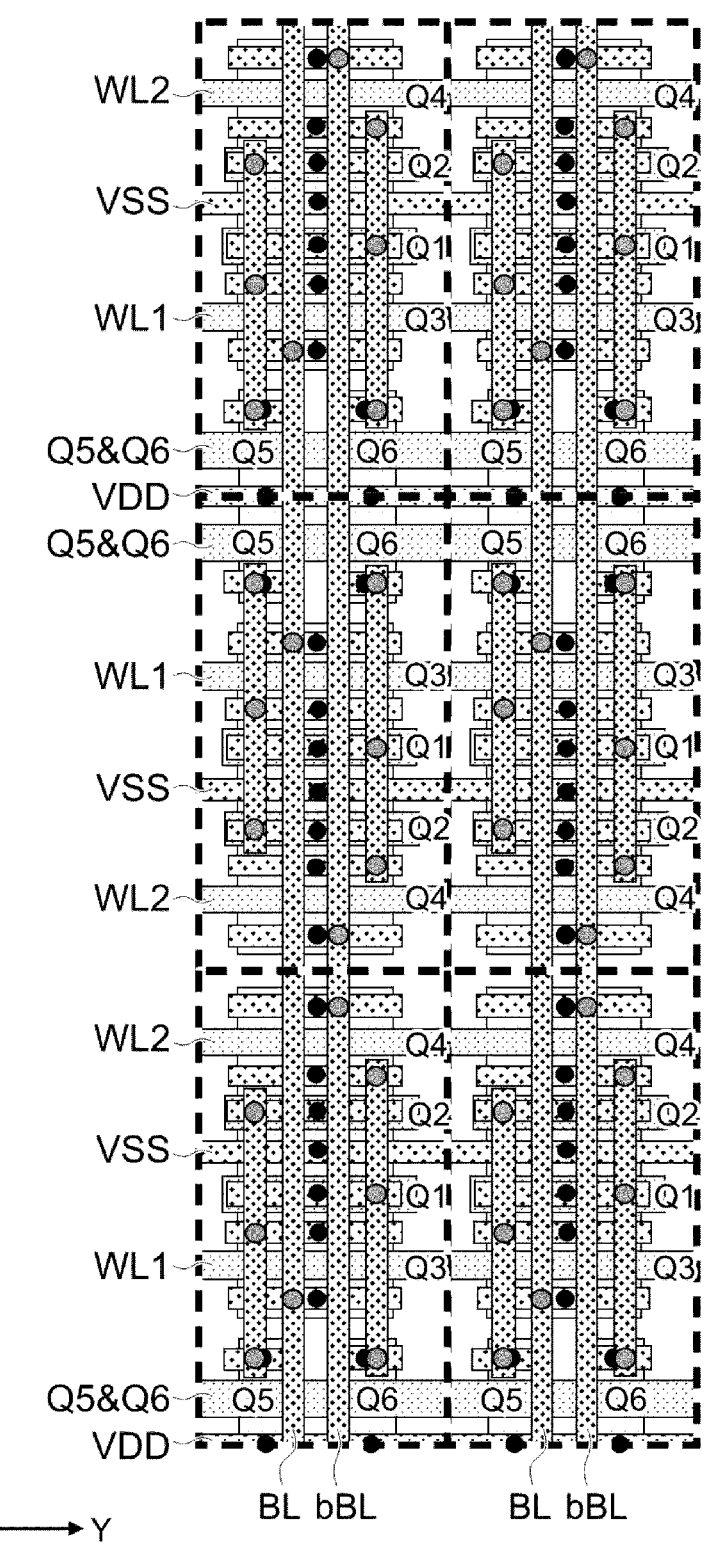
FIG. 21 is a layout diagram in which a plurality of data latch circuits having layout arrangement in FIG. 20 are located in the two-dimensional direction.

FIG. 21 is a layout diagram in which a plurality of data latch circuits 10c having the layout arrangement in FIG. 20 are located in the two-dimensional direction. The plurality of data latch circuits 10c shown in FIG. 21 are located line-symmetrically with respect to an axis extending in the second direction Y.

The layout arrangement shown in FIG. 21 is only an example, and various modifications thereof can be considered. For example, it is possible to adopt a point-symmetrical layout arrangement.

As described above, since the data latch circuit 10c according to the fourth embodiment is formed of six transistors Q1 to Q6, the same effect as that of the third embodiment can be obtained.

In addition, each of the above-described embodiments can be applied and used even in an environment at temperature of 50° C. or lower, room temperature, or temperature lower than the same by using immersion or the like. Each of the embodiments can also be applied and used in an extremely low temperature environment of −40° C. or lower to −196° C. of liquid nitrogen temperature.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A data latch circuit comprising:

a first transistor of a first conductivity type and a second transistor of the first conductivity type; and a third transistor of a second conductivity type and a fourth transistor of the second conductivity type, wherein a source of the first transistor and a source of the second transistor are connected to a predetermined first reference voltage node, a source of the third transistor is connected to a drain of the first transistor and a gate of the second transistor, a source of the fourth transistor is connected to a drain of the second transistor and a gate of the first transistor, a data wiring layer is connected to a drain of the third transistor and a drain of the fourth transistor, a first gate layer is connected to a gate of the third transistor and not connected to the gate of the first transistor, a second gate layer is connected to a gate of the fourth transistor and not connected to the gate of the second transistor, and the third and fourth transistors are controlled according to a first control signal supplied to the first gate layer and a second control signal supplied to the second gate layer, respectively, to perform a first control operation to store data corresponding to a voltage applied to the data wiring layer in the data latch circuit and to perform a second control operation to read the stored data.

2. The data latch circuit according to claim 1, wherein voltage levels of the first gate layer and the second gate layer in a period during which the data is retained are lowered by any percentage in a range of 5 to 30% of uppermost voltage levels of the first gate layer and the second gate layer when the data is written.

3. The data latch circuit according to claim 2, further comprising:

first and second diffusion regions that are located apart from each other in a first direction on a semiconductor substrate;

a third gate layer connected to the gate of the first transistor; and a fourth gate layer connected to the gate of the second transistor, wherein:

source and drain of each of the first transistor and the second transistor are located on the first diffusion region, source and drain of each of the third transistor and the fourth transistor are located on the second diffusion region, the first gate layer and the second gate layer extend in a second direction intersecting the first direction so as to overlap the second diffusion region in a stacking direction, the data wiring layer extends in the first direction so as to overlap the first diffusion region and the second diffusion region in the stacking direction, and the third gate layer and the fourth gate layer extend in the second direction, respectively, so as to overlap the first diffusion region in the stacking direction, and are located apart from each other in the first direction.

4. The data latch circuit according to claim 2, further comprising:

first, second, third, and fourth diffusion regions, that are located apart from each other in a second direction intersecting a first direction on a semiconductor substrate;

a third gate layer connected to the gate of the first transistor; and a fourth gate layer connected to the gate of the second transistor, wherein:

the first, second, third, and fourth gate layers extend in the first direction, respectively, and are located apart from each other in the second direction, and the data wiring layer is located between the second diffusion region and the third diffusion region and extends in the first direction.

5. A data latch circuit comprising:

a first transistor of a first conductivity type and a second transistor of the first conductivity type;

a third transistor of a second conductivity type and a fourth transistor of the second conductivity type;

a first gate layer connected to a gate of the third transistor and a gate of the fourth transistor;

a first data wiring layer connected to a drain of the third transistor; and a second data wiring layer connected to a drain of the fourth transistor, wherein a source of the first transistor and a source of the second transistor are connected to a predetermined first reference voltage node, a source of the third transistor is connected to a drain of the first transistor and a gate of the second transistor, a source of the fourth transistor is connected to a drain of the second transistor and a gate of the first transistor, the third and fourth transistors are controlled according to a control signal through the first gate layer to perform a first control operation to store data corresponding to voltages applied to the first and second data wiring layers in the data latch circuit and to perform a second control operation to read the stored data.

6. The data latch circuit according to claim 5, wherein a voltage level of the first gate layer in a period during which the data is retained in the data latch circuit is lowered by any percentage in a range of 5 to 30% of a power supply voltage level.

7. The data latch circuit according to claim 6, further comprising:

first and second diffusion regions that are located apart from each other in a second direction intersecting a first direction on a semiconductor substrate;

a third diffusion region located apart from the first diffusion region and the second diffusion region in the first direction;

a second gate layer connected to the gate of the first transistor; and a third gate layer connected to the gate of the second transistor, wherein source and drain of the first transistor are located on the first diffusion region, source and drain of the second transistor are located on the second diffusion region, source and drain of each of the third transistor and the fourth transistor are located on the third diffusion region, the first gate layer extends in the second direction so as to overlap the first diffusion region and the second diffusion region in the stacking direction, the second gate layer and the third gate layer extend in the second direction, respectively, so as to overlap the third diffusion region in the stacking direction, and are located apart from each other in the first direction, the first data wiring layer extends in the first direction so as to overlap the first diffusion region and the third diffusion region in the stacking direction, and the second data wiring layer extends in the first direction so as to overlap the second diffusion region and the third diffusion region in the stacking direction.

8. The data latch circuit according to claim 6, further comprising:

first, second, third, and fourth diffusion regions, that are located apart from each other in a second direction intersecting a first direction on a semiconductor substrate;

a first gate layer connected to the gate of the third transistor;

a second gate layer connected to the gate of the fourth transistor;

a third gate layer connected to the gate of the first transistor; and a fourth gate layer connected to the gate of the second transistor, wherein:

source and drain of the first transistor are located on the first diffusion region, source and drain of the second transistor are located on the fourth diffusion region, source and drain of the third transistor are located on the second diffusion region, source and drain of the fourth transistor are located on the third diffusion region, the first data wiring layer extends in the first direction so as to overlap the second diffusion region in the stacking direction, and the second data wiring layer extends in the first direction so as to overlap the third diffusion region in the stacking direction.

9. A semiconductor storage device comprising:

a memory cell array having a bit line and first and second word lines; and a data latch circuit configured to temporarily store data to be written to the memory cell array and the data read from the memory cell array, wherein the data latch circuit comprises:

a data storage circuit including at least two, but no more than four transistors of a first conductivity type, the at least two transistors of the first conductivity type including first and second transistors, and third and fourth transistors of a second conductivity type, and further wherein a source of the first transistor and a source of the second transistor are connected to a predetermined first reference voltage node, a source of the third transistor is connected to a drain of the first transistor and a gate of the second transistor, a source of the fourth transistor is connected to a drain of the second transistor and a gate of the first transistor, a data wiring layer is connected to the bit line, a drain of the third transistor, and a drain of the fourth transistor, a first gate layer is connected to the first word line and a gate of the third transistor, a second gate layer is connected to the second word line and a gate of the fourth transistor, and the third and fourth transistors are controlled according to a first control signal supplied to the first gate layer and a second control signal supplied to the second gate layer, respectively, to perform a first control operation to store data corresponding to a voltage applied to the data wiring layer in the data latch circuit and to perform a second control operation to read the stored data.

10. The semiconductor storage device according to claim 9, wherein the data storage circuit includes four transistors of the first conductivity type.

* * * * *